(12) United States Patent
Huang et al.

(10) Patent No.: US 11,509,315 B2
(45) Date of Patent: Nov. 22, 2022

(54) FRACTIONAL-N PHASE-LOCKED LOOP AND SLICED CHARGE PUMP CONTROL METHOD THEREOF

(71) Applicant: MEDIATEK INC., Hsin-Chu (TW)

(72) Inventors: Po-Chun Huang, Hsinchu (TW); Yu-Li Hsueh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/462,014

(22) Filed: Aug. 31, 2021

(65) Prior Publication Data
US 2022/0123754 A1    Apr. 21, 2022

Related U.S. Application Data

(60) Provisional application No. 63/093,325, filed on Oct. 19, 2020.

(51) Int. Cl.
*H03L 7/087* (2006.01)
*H03L 7/197* (2006.01)

(52) U.S. Cl.
CPC .......... *H03L 7/087* (2013.01); *H03L 7/1976* (2013.01)

(58) Field of Classification Search
CPC ..... H03L 7/1976; H03L 7/1974; H03L 7/197; H03L 7/18; H03L 7/16; H03L 7/087; H03L 7/085; H03L 7/08; H03L 7/06
See application file for complete search history.

(56) References Cited

U.S. PATENT DOCUMENTS

| | | | |
|---|---|---|---|
| 7,327,820 B2 | 2/2008 | Meninger | |
| 10,236,895 B1 | 3/2019 | Rogers | |
| 10,396,808 B2 * | 8/2019 | Sun | ........................ H03L 7/1974 |
| 10,680,624 B2 * | 6/2020 | Kearney | ............... H03L 7/1976 |
| 2002/0136341 A1 | 9/2002 | Huh | |
| 2008/0224789 A1 | 9/2008 | Chang | |
| 2010/0283549 A1 | 11/2010 | Wang | |

(Continued)

OTHER PUBLICATIONS

Davide Tasca, Marco Zanuso, Giovanni Marzin, Salvatore Levantino, Carlo Samori, Andrea L. Lacaita, "A 2.9-to-4.0GHz fractional-N digital PLL with bang-bang phase detector and 560fsrms integrated jitter at 4.5mW power", ISSCC, 2011, IEEE, USA.

(Continued)

*Primary Examiner* — Diana J. Cheng
(74) *Attorney, Agent, or Firm* — Winston Hsu

(57) ABSTRACT

A fractional-N phase locked loop (PLL) and a sliced charge pump (CP) control method thereof are provided. The fractional-N PLL includes a first current source, a first phase frequency detector (PFD), a second current source, a second PFD, and a divided clock controller. The first current source provides a first current. The first PFD generates a first detection signal according to a first divided clock, for controlling the first current source, wherein the first divided clock is generated according to an oscillation clock having an oscillation period. The second current source provides a second current. The second PFD generates a second detection signal according to a second divided clock, for controlling the second current source. The divided clock controller controls the second divided clock based on a variable delay relative to the first divided clock, wherein the variable delay is an integer times the oscillation period.

16 Claims, 10 Drawing Sheets

(56) References Cited

U.S. PATENT DOCUMENTS

2016/0156364 A1    6/2016  Chen
2016/0211855 A1    7/2016  Unruh
2018/0212611 A1    7/2018  Shen

OTHER PUBLICATIONS

Yanlong Zhang et al., A Fractional-N PLL With Space-Time Averaging for Quantization Noise Reduction, IEEE Journal of Solid-State Circuits, vol. 55, No. 3, Mar. 2020, pp. 602-614, XP011774167.

* cited by examiner

FRACTIONAL-N PHASE-LOCKED LOOP AND SLICED CHARGE PUMP CONTROL METHOD THEREOF

CROSS REFERENCE TO RELATED APPLICATIONS

This application claims the benefit of U.S. provisional application No. 63/093,325, which was filed on Oct. 19, 2020, and is included herein by reference.

BACKGROUND

The present invention is related to phase-locked loops (PLLs), and more particularly, to a fractional-N PLL (e.g. an analog fractional-N PLL) and a sliced charge pump control method thereof.

In a general PLL, a frequency divider may be utilized to divide a frequency of an oscillation clock by a target divisor to generate a feedback clock, which is configure to be compared with a reference clock, where the target divisor depends on the frequency to be synthesized based on the reference clock. In practice, the frequency divider can divide the frequency by an integer divider only. Thus, if the divisor of the frequency divider is fixed, the PLL can synthesize an integer times the frequency of the reference clock only.

For a purpose of synthesizing a non-integer times the frequency of the reference clock, the divisor of the frequency divider may be varying in a random-like manner. By a long-term operation, the frequency divider may bring the effect of a non-integer divisor in average, and thereby implement a fractional-N PLL. The aforementioned random-like manner directly or indirectly introduces phase noise (e.g. in-band phase noise and/or out-band phase noise), however. Although related arts indeed propose some phase noise reduction methods, these methods are demanding on timing accuracy, and therefore require calibration mechanisms or scrambling mechanism such as Pseudo Random Permutation Scrambling (PRPS) to avoid spur or folding noise issues, where the required calibration circuit may greatly increase overall circuit area power consumption.

Thus, there is a need for a novel architecture of the fractional-N phase locked loop, to reduce the phase noise without introducing any side effect or in a way that is less likely to introduce side effects.

SUMMARY

In view of above, an objective of the present invention is to provide a fractional-N phase locked loop (PLL) and a sliced charge pump (CP) control method thereof, to reduce overall phase noise of the fractional-N PLL without greatly increase additional area and power consumption.

Another objective of the present invention is to provide a fractional-N PLL and a sliced charge pump CP control method thereof, to reduce overall power consumption without increasing overall phase noise of the fractional-N PLL.

At least one embodiment of the present invention provides a fractional-N PLL. The fractional-N PLL may comprise a first current source, a first phase frequency detector (PFD) coupled to the first current source, a second current source, a second PFD coupled to the second current source, and a divided clock controller coupled to the first PFD and the second PFD. The first current source is configured to provide a first current. The first PFD is configured to generate a first detection signal according to a first divided clock, for controlling the first current source, wherein the first divided clock is generated according to an oscillation clock having an oscillation period. The second current source is configured to provide a second current. The second PFD is configured to generate a second detection signal according to a second divided clock, for controlling the second current source. The divided clock controller is configured to control the second divided clock based on a variable delay relative to the first divided clock, wherein the variable delay is an integer times the oscillation period.

At least one embodiment of the present invention provides a sliced CP control method of a fractional-N PLL. The method may comprise: providing a first current by a first current source of the fractional-N PLL; generating a first detection signal according to a first divided clock by a first phase frequency detector (PFD) of the fractional-N PLL, for controlling the first current source, wherein the first divided clock is generated according to an oscillation clock having an oscillation period; providing a second current by a second current source of the fractional-N PLL; generating a second detection signal according to a second divided clock by a second PFD of the fractional-N PLL, for controlling the second current source; and controlling the second divided clock based on a variable delay relative to the first divided clock by a divided clock controller of the fractional-N PLL, wherein the variable delay is an integer times the oscillation period.

The fractional-N PLL of the embodiments of the present invention can reduce the phase noise with aid of sliced charge pump (e.g. sliced into the first current source and the second current source), where timing mismatch between the first current source and the second current source may not participate in sigma-delta modulation, and therefore may have no noise folding concern, which means complicated calibration or scrambling mechanism are not required. In addition, as phase noise of SDM, CP and PFD can be effectively reduced, VCO within the fractional-N PLL can be implemented by a lower power configuration, and overall noise related performance of the fractional-N PLL can be maintained. Thus, the present invention can improve overall performance of the fractional-N PLL without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
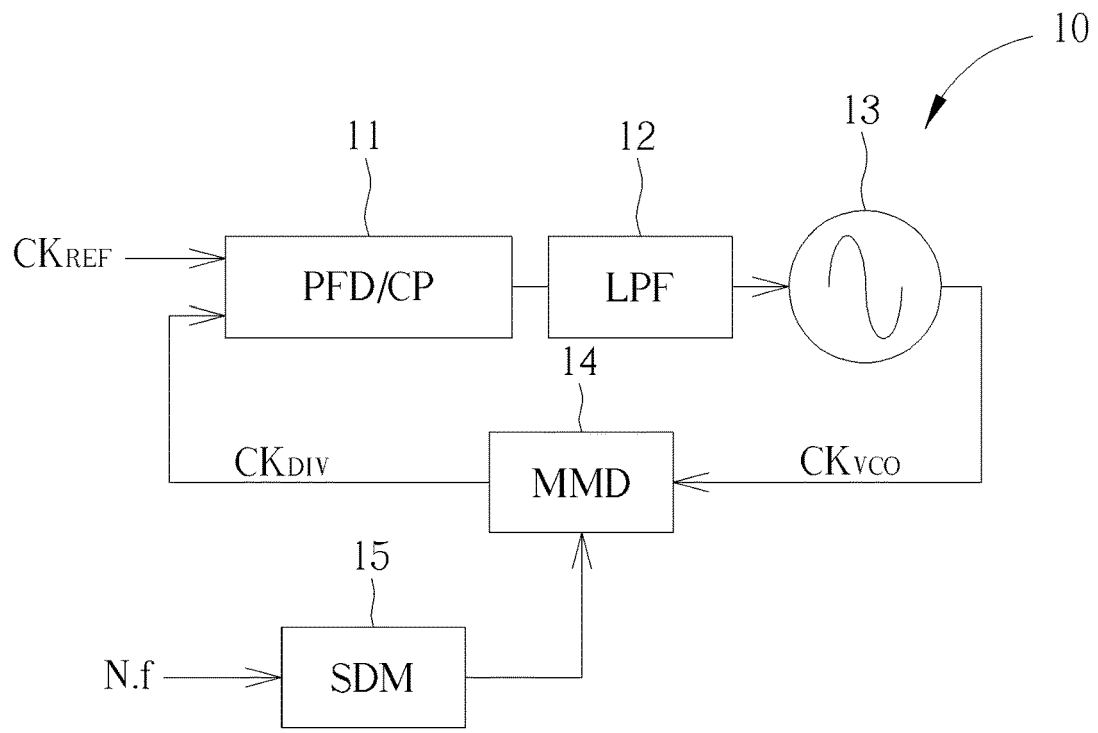
FIG. 1 is a diagram illustrating a fractional-N phase-locked loop (PLL) according to an embodiment of the present invention.

FIG. 1 is a diagram illustrating a fractional-N phase-locked loop (PLL) 10 according to an embodiment of the present invention. The fractional-N PLL 10 may be configured to generate an output clock according to a reference clock $CK_{REF}$ and a non-integer value such as "N.f", where "N" may represent an integer portion of the non-integer value, and "f" may represent a fractional portion of the non-integer value. In particular, a frequency of the output clock may be "N.f" times that of the reference clock $CK_{REF}$. The reference clock may be provided by a crystal oscillator (not shown), but the present invention is not limited thereto. As shown in FIG. 1, the fractional-N PLL may comprise a phase frequency detector (PFD) with charge pump (CP) 11 (labeled "PFD/CP" in FIG. 1 for brevity), a low-pass filter (LPF) 12, a voltage controlled oscillator (VCO) 13, a multi-modulus divider (MMD) 14 and a sigma-delta modulator (SDM) 15, where the PFD with CP 11, the LPF 12, the VCO 13 and the MMD 14 may form a close-loop as shown in FIG. 1, and the SDM 15 may control operations of the MMD 14. In detail, the VCO 13 may generate a VCO clock $CK_{VCO}$ according to a control voltage from the LPF 12, e.g. a frequency of the VCO clock $CK_{VCO}$ may be determined by the control voltage. The MMD 14 may divide the frequency of the VCO clock $CK_{VCO}$ by a variable integer divisor, to generate a divided clock $CK_{DIV}$, where the variable integer divisor is controlled by the SDM 15. The PFD with CP 11 may detect a phase difference between the reference clock $CK_{REF}$ and the divided clock $CK_{DIV}$, and then a CP current $I_{CP,0}$ may be provided to an input terminal of the LPF 12 according to the phase difference (e.g. a period between a rising edge of the reference clock $CK_{REF}$ and a rising edge of the divided clock $CK_{DIV}$ may represent the period of providing the CP current $I_{CP,0}$ to the LPF 12), for controlling an input voltage of the LPF 12.

Figure 2:
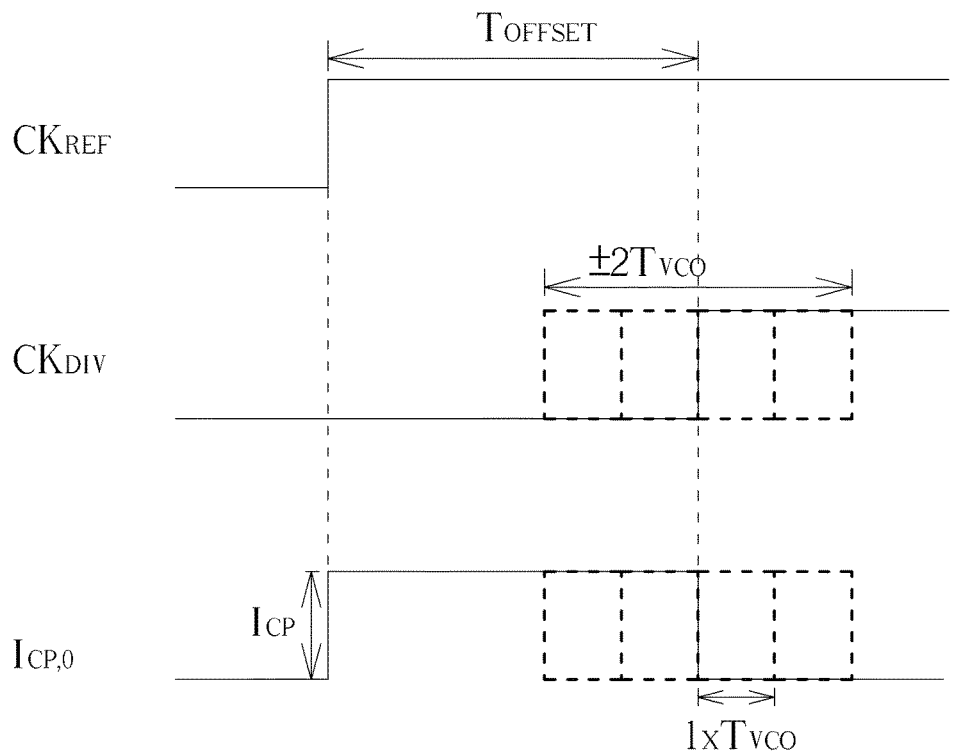
FIG. 2 is a diagram illustrating a reference clock, a divided clock and a charge pump (CP) current according to an embodiment of the present invention.

As the divided clock $CK_{DIV}$ is generated according to the variable integer divisor, an edge of the divided clock $CK_{DIV}$ may vary as shown in FIG. 2, where FIG. 2 is a diagram illustrating the reference clock $CK_{REF}$, the divided clock $CK_{DIV}$ and the CP current $I_{CP,0}$ according to an embodiment of the present invention, where the period of providing the CP current $I_{CP,0}$ to the LPF 12 may be illustrated by a high state of the CP current $I_{CP,0}$. If the SDM 15 is a first-order SDM, the edge of the divided clock $CK_{DIV}$ may vary within a range of $\pm 1 T_{VCO}$, where $T_{VCO}$ may represent a cycle period of the VCO clock $CK_{VCO}$; if the SDM 15 is a second-order SDM, the edge of the divided clock $CK_{DIV}$ may vary within a range of $\pm 2 T_{VCO}$; and behaviors of the divided clock $CK_{DIV}$ under other implementations of the SDM 15 may be deduced by analogy. The embodiment of FIG. 2 takes the second-order SDM as an example, but the present invention is not limited thereto. In this embodiment, an offset interval $T_{OFFSET}$ is set (e.g. predetermined) to ensure that the PFD with CP 11 (e.g. a CP therein) always operates under a linear behavior regarding phase differences (e.g. to ensure that the detected phase difference between the edge of the reference clock $CK_{REF}$ and the edge of the divided clock $CK_{DIV}$ always falls in a linear region).

As shown in FIG. 2, when the divided clock $CK_{DIV}$ is generated according to a different divisor, timing of the edge of the divided clock $CK_{DIV}$ may vary, and the period of providing the CP current $I_{CP,0}$ to the LPF 12 may accordingly vary, where the CP current $I_{CP,0}$ may be $I_{CP}$ as shown in FIG. 2. In the embodiment of FIG. 2, a unit step of charge variation (which may be referred to as a quantization step) on the input terminal of the LPF 12 may be represented by $1 \times I_{CP} \times T_{VCO}$. In some embodiment, the quantization step may be decreased for lowering noise of SDM and noise of CPs (which may be referred to as SDM noise and CP noise respectively). For example, when the quantization step is decreased, a spreading/shifting range of the rising edge of the $CK_{DIV}$ shown in FIG. 2 can be reduced, which results that SDM noise is therefore reduced. In addition, when the spreading/shifting range of the rising edge of the $CK_{DIV}$ shown in FIG. 2 is reduced, the varying rising edge of the $CK_{DIV}$ is therefore become farther from the rising edge of the reference clock $CK_{REF}$, which means the offset interval $T_{OFFSET}$ can be reduced without making the detected phase difference falls in a nonlinear region, and therefore CP noise can be reduced.

Figure 3:
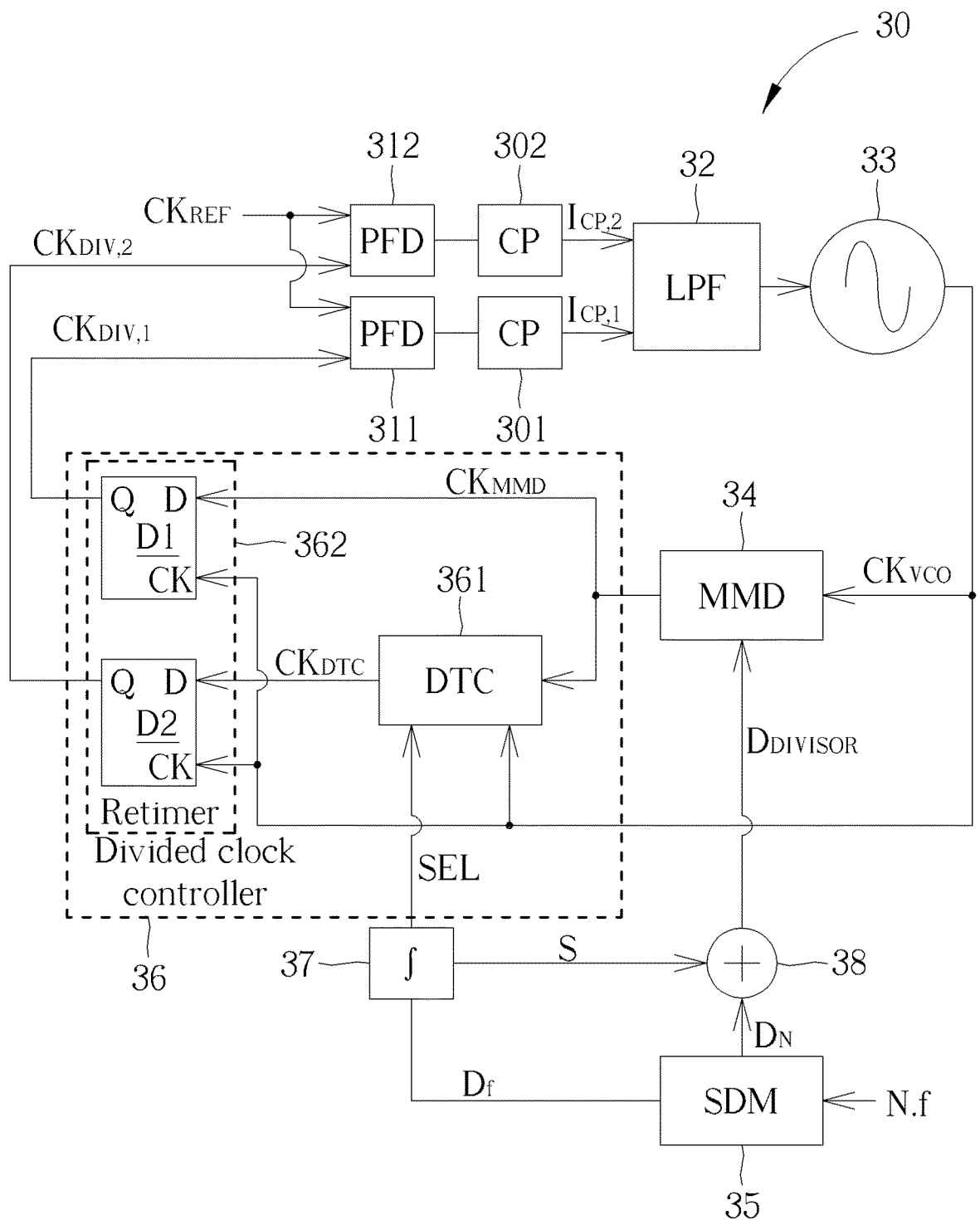
FIG. 3 is a diagram illustrating a fractional-N PLL according to an embodiment of the present invention.

FIG. 3 is a diagram illustrating a fractional-N PLL 30 according to an embodiment of the present invention. As shown in FIG. 3, the fractional-N PLL 30 may comprise a first current source such as a CP 301, a first PFD such as a PFD 311 coupled to the CP 301, a second current source such as a CP 302, a second PFD such as a PFD 312 coupled to the CP 302, and a divided clock controller 36, wherein the divided clock controller 36 is coupled to the PFDs 311 and 312. The fractional-N PLL 30 may further comprise a LPF 32 coupled to the CPs 301 and 302, a VCO 33 coupled to the LPF 32, a MMD 34 coupled between the VCO 33 and the divided clock controller 36, a SDM 35, an accumulator 37 coupled between the SDM 35 and the divided clock controller 36, and an adder 38 coupled to the MMD 34, the SDM 35 and the accumulator 37. In this embodiment, the PFD with CP 11 is sliced into two branches as shown in FIG. 3, where the connection from the PFD 311 to the CP 301 is fixed, and the connection from the PFD 312 to the CP 302 is fixed.

In this embodiment, the CP 301 is configured to provide a first current such as a CP current $I_{CP,1}$, and the CP 302 is configured to provide a second current such as a CP current $I_{CP,2}$. As an input terminal of the LPF 32 receives the CP currents $I_{CP,1}$ and $I_{CP,2}$, to generate an input voltage of the LPF 32, and this input voltage may be filtered by the LPF 32 to output an control voltage, where the VCO 33 may generate an oscillation clock such as the VCO clock $CK_{VCO}$ having an oscillation period such as $T_{VCO}$, and the frequency (i.e. $1/T_{VCO}$) of the VCO clock $CK_{VCO}$ is controlled by this control voltage. As shown in FIG. 3, the PFD 311 is configured to generate a first detection signal according to a first divided clock such as a divided clock for controlling the CP 301, and the PFD 312 is configured to generate a second detection signal according to a second divided clock such as a divided clock $CK_{DIV,2}$, for controlling the CP 302. For example, the PFD 311 may detect a first phase difference between a reference clock $CK_{REF}$ and the divided clock $CK_{DIV,1}$, and may be dedicated to control the CP 301 to output the CP current $I_{CP,1}$ to the LPF 32 based on the first phase difference; and the PFD 312 may detect a second phase difference between the reference clock $CK_{REF}$ and the divided clock $CK_{DIV,2}$, and may be dedicated to control the CP 302 to output the CP current $I_{CP,2}$ to the LPF 32 based on the second phase difference. In particular, the divided clock $CK_{DIV,1}$ is generated according to the VCO clock $CK_{VCO}$, and the divided clock controller 36 is configured to control the divided clock $CK_{DIV,2}$ to have a variable delay relative to the divided clock $CK_{DIV,1}$, wherein the variable delay may be an integer times the oscillation period $T_{VCO}$.

In this embodiment, the MMD 34 is configured to divide the frequency of the VCO clock $CK_{VCO}$ by a variable integer divisor such as a divisor $D_{DIVISOR}$ to generate a divided clock $CK_{MMD}$, and the SDM 35 is configured to generate at least one modulated signal according to a target divisor such as the aforementioned "N.f". More particularly, the variable delay and the divisor $D_{DIVISOR}$ are controlled by the SDM 35 with aid of the at least one modulated signal. For example, the at least one modulated signal may be represented by a multi-bit signal $\{D_N, D_f\}$, where a first portion (e.g. the signal $D_N$) of this multi-bit signal may correspond to the integer portion "N" of the target divisor "N.f", and a second portion (e.g. the signal $D_N$) of this multi-bit signal may correspond to the fractional portion "f" of the target divisor "N.f", but the present invention is not limited thereto. The signal $D_N$ may be transmitted to the adder 38, and the signal $D_f$ may be transmitted to the accumulator 37. In detail, the accumulator 37 may accumulate values of the signal $D_f$ in every cycle of the VCO clock $CK_{VCO}$, to generate an accumulation result represented by a selection signal SEL and a signal S representing a carrier bit of the accumulation result, and the adder 38 may add the signal $D_N$ and the signal S to generate the divisor $D_{DIVISOR}$ for controlling operations of the MMD 34.

In this embodiment, the divided clock controller 36 may comprise a digital-to-time converter (DTC) 361 coupled to the MMD 34, and the DTC 361 is configured to delay the divided clock $CK_{MMD}$ by B times the oscillation period $T_{VCO}$ for generating a divided clock $CK_{DTC}$, where B is an integer controlled by the selection signal SEL varying in response to the at least one modulated signal (e.g. the signal $D_f$ within the multi-bit signal $\{D_N, D_f\}$). Assume that B has four candidate values such as 0, 1, 2 and 3. When $D_N=4$ and $D_f=1$, the selection signal SEL may be 1 (which means B=1) and the signal S may be 0 at a first cycle of the VCO clock $CK_{VCO}$, and therefore the divisor $D_{DIVISOR}$ may be 4 at the first cycle; the selection signal SEL may be accumulated to 2 (which means B=2) and the signal S may be 0 at a second cycle of the VCO clock $CK_{VCO}$, and therefore the divisor $D_{DIVISOR}$ may be 4 at the second cycle; the selection signal SEL may be accumulated to 3 (which means B=3) and the signal S may be 0 at a third cycle of the VCO clock $CK_{VCO}$, and therefore the divisor $D_{DIVISOR}$ may be 4 at the third cycle; and the selection signal SEL may be accumulated to 4 returning to 0 (which means B also returns to 0) and the signal S may be 1 (due to the selection returning to 0 from 4) at a fourth cycle of the VCO clock $CK_{VCO}$, and therefore the divisor $D_{DIVISOR}$ may be 5 at the fourth cycle. In the example mentioned above, the signals $D_N$ and $D_f$ are assumed to be constant values for better illustration, but the present invention is not limited thereto. In some embodiments, each of the values of signals $D_N$ and $D_f$ may vary among multiple integers.

In addition, the divided clock controller 36 may further comprise a retiming circuit such as a retimer 362 coupled to the MMD 34, the DTC 361, the PFD 311 and the PFD 312, and the retimer 362 is configured to retime the divided clocks $CK_{MMD}$ and $CK_{DTC}$ according to the VCO clock $CK_{VCO}$, and thereby output the divided clocks $CK_{DIV,1}$ and $CK_{DIV,2}$ to the PFDs 311 and 312, respectively. Thus, the clocks $CK_{DIV,1}$ and $CK_{DIV,2}$ may be regarded as retimed versions of the divided clocks $CK_{MMD}$ and $CK_{DTC}$, respectively. In detail, the retimer 362 may comprise a first flip-flop such as a flip-flop D1 and a second flip-flop such as a flip-flop D2, where the flip-flop D1 is coupled between the MMD 34 and the PFD 311, and the flip-flop D2 is coupled between the DTC 361 and the PFD 312. The flip-flop D1 is configured to transmit the divided clock $CK_{MMD}$ from the MMD 34 to the PFD 311 at edges of the VCO clock $CK_{VCO}$ (e.g. receive the divided clock $CK_{MMD}$ by a terminal labeled "D" and output the divided clock $CK_{DIV,1}$ from a terminal labeled "Q" according to timing of the VCO clock $CK_{VCO}$ on a terminal labeled "CK"), and the flip-flop D2 is configured to transmit the divided clock $CK_{DTC}$ from the DTC 361 to the PFD 312 at the edges of the VCO clock $CK_{VCO}$ (e.g. receive the divided clock $CK_{DTC}$ by a terminal labeled "D" and output the divided clock $CK_{DIV,2}$ from a terminal labeled "Q" according to timing of the VCO clock $CK_{VCO}$ on a terminal labeled "CK"). Each of the flip-flops D1 and D2 may be a D-type flip-flop (DFF), but the present invention is not limited thereto.

Figure 4:
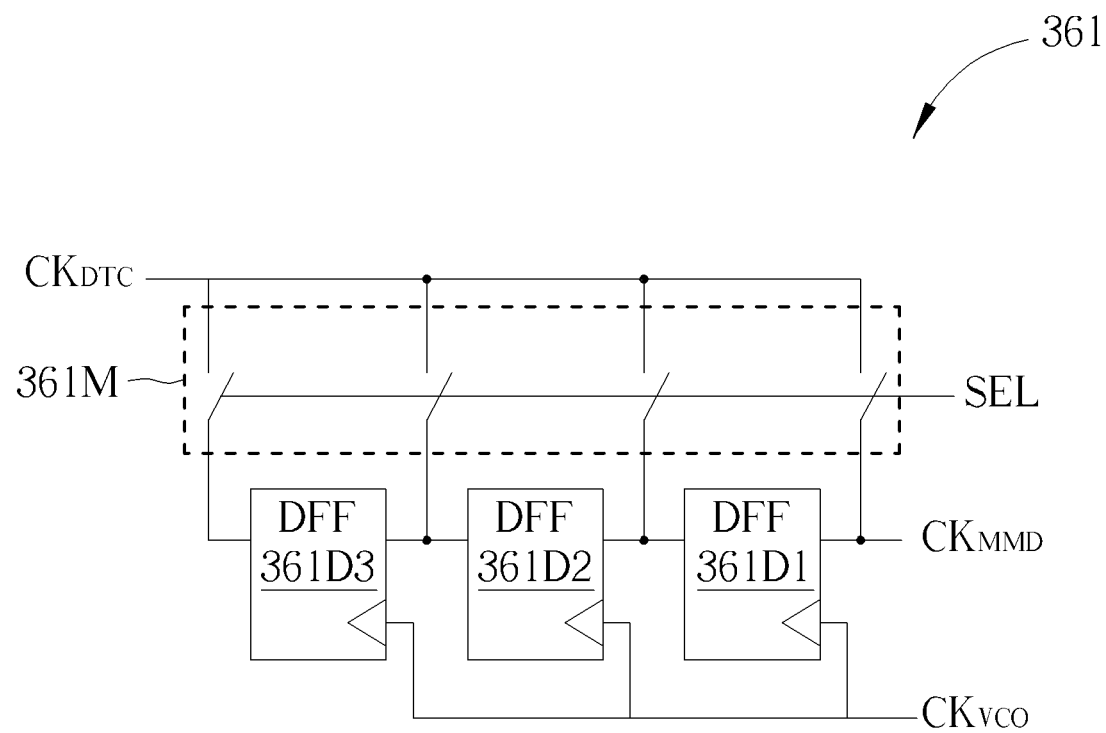
FIG. 4 is a diagram illustrating an example of a digital-to-time converter (DTC) shown in FIG. 3.

FIG. 4 is a diagram illustrating an example of the DTC 361 shown in FIG. 3. As shown in FIG. 4, the DTC 361 may comprise one or more delay cells such as DFFs 361D1, 361D2 and 361D3, where the DFFs 361D1, 361D2 and 361D3 are configured to generate one or more delayed clocks, respectively. As the DFFs 361D1, 361D2 and 361D3 are connected in series (which may be regarded as a DFF array) and clock terminals thereof are configured to receive the VCO clock $CK_{VCO}$ as shown in FIG. 4, a first delayed clock output from the DFF 361D1 may have a $1 \times T_{VCO}$ delay relative to the divided clock $CK_{MMD}$, a second delayed clock output from the DFF 361D2 may have a $2 \times T_{VCO}$ delay relative to the divided clock $CK_{MMD}$, and a third delayed clock output from the DFF 361D3 may have a $3 \times T_{VCO}$ delay relative to the divided clock CK. In addition, the DTC 361 may further comprise a multiplexer (MUX) 361M, wherein the MUX 361M receives the divided clock $CK_{MMD}$ and is coupled to the DFFs 361D1, 361D2 and 361D3, and the MUX 361M is configured to select a selected clock from a plurality of candidate clocks to be the divided clock $CK_{DTC}$ according to the selection signal, where the candidate clocks may comprise the divided clock $CK_{MMD}$ and the one or more delayed clocks such as the first delayed clock, the second delayed clock and the third delayed clock. For example, when the selection signal is a first value (e.g. "00"), the divided clock $CK_{MMD}$ may be selected to be the divided clock $CK_{DTC}$; when the selection signal is a second value (e.g. "01"), the first delayed clock having the $1 \times T_{VCO}$ delay may be selected to be the divided clock $CK_{DTC}$; when the selection signal is a third value (e.g. "10"), the second delayed clock having the $2 \times T_{VCO}$ delay may be selected to be the divided clock $CK_{DTC}$; and when the selection signal is a fourth value (e.g. "11"), the third delayed clock having the $3 \times T_{VCO}$ delay may be selected to be the divided clock $CK_{DTC}$. Thus, the selection signal SEL may be configured to control the aforementioned variable delay. It should be noted that B has four candidate values (e.g. 0, 1, 2 and 3) in the embodiment of FIG. 4, but the present invention is not limited thereto. For example, the number of DFFs within the DTC 361 may vary in response to a desired number of candidate values of B (which may be regarded as the number of quantization levels). Those skilled in this art should understand how to modify the architecture shown in FIG. 4 in order to obtain the desired number of quantization levels, and related details are omitted here for brevity.

In some embodiments, the DFFs 361D1, 361D2 and 361D3 may be replaced with voltage control delay cells (VCDL), where each of the VCDLs may comprise tunable resistor(s) or tunable capacitor(s) for tuning delays thereof, and at least one phase detector may be included in the DTC 361 for calibrating delays provided by the VCDLs by tuning the tunable resistor(s) or tunable capacitor(s) therein. Those skilled in this art should understand how to apply VCDLs to the implementation of the DTC 361, and related details are omitted here for brevity.

Figure 5:
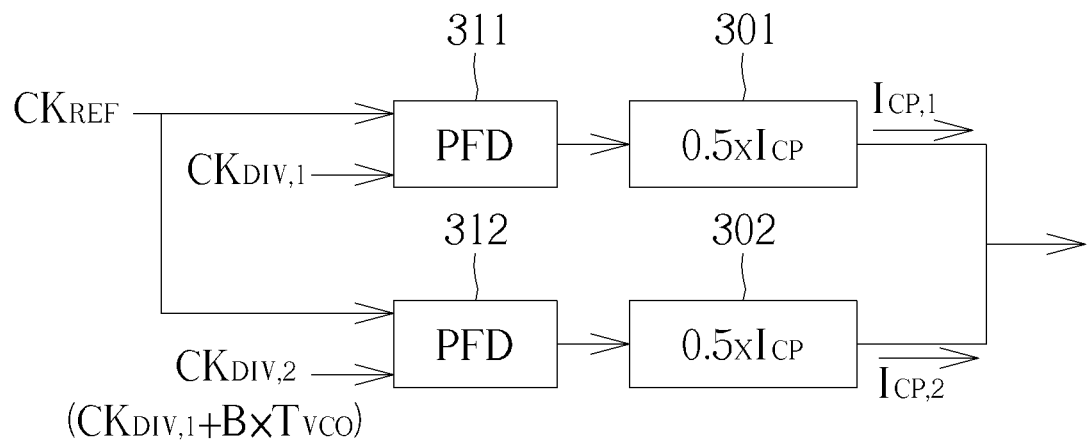
FIG. 5 is a diagram illustrating some details related to phase frequency detectors (PFDs) and CPs according to an embodiment of the present invention.

FIG. 5 is a diagram illustrating some details related to PFDs (e.g. the PFDs 311 and 312) and CPs (e.g. the CPs 302 and 301) according to an embodiment of the present invention. In this embodiment, it is assumed that B has two candidate values (e.g. B=0 or 1), and the CP current $I_{CP}$ may be sliced into the CP current $I_{CP,1}$ provided by the CP 301 and the CP current $I_{CP,2}$ provided by the CP 302, where the CP current $I_{CP,1}$ may be $0.5 \times I_{CP}$ and the CP current $I_{CP,2}$ may be $0.5 \times I_{CP}$ (which are respectively labeled on the CPs 301 and 302 for better comprehension), and therefore makes a total CP current of this embodiment be the same as the embodiment of FIG. 2. As mentioned in the embodiment of FIG. 3, the PFD 311 may detect the first phase difference between the reference clock $CK_{REF}$ and the divided clock $CK_{DIV,1}$, and the PFD 312 may detect the second phase difference between the reference clock $CK_{REF}$ and the divided clock $CK_{DIV,2}$, where a period between a rising edge of the reference clock $CK_{REF}$ and a rising edge of the divided clock $CK_{DIV,1}$ may represent the period of providing the CP current $I_{CP,1}$ (e.g. $0.5 \times I_{CP}$) to the LPF 32, and a period between a rising edge of the reference clock $CK_{REF}$ and a rising edge of the divided clock $CK_{DIV,2}$ may represent the period of providing the CP current $I_{CP,2}$ (e.g. $0.5 \times I_{CP}$) to the LPF 32. In this embodiment, the divided clock $CK_{DIV,2}$ has a variable delay $B \times T_{VCO}$ relative to the $CK_{DIV,1}$, and is therefore illustrated by "$CK_{DIV,1} + B \times T_{VCO}$" for better comprehension.

Figure 6:
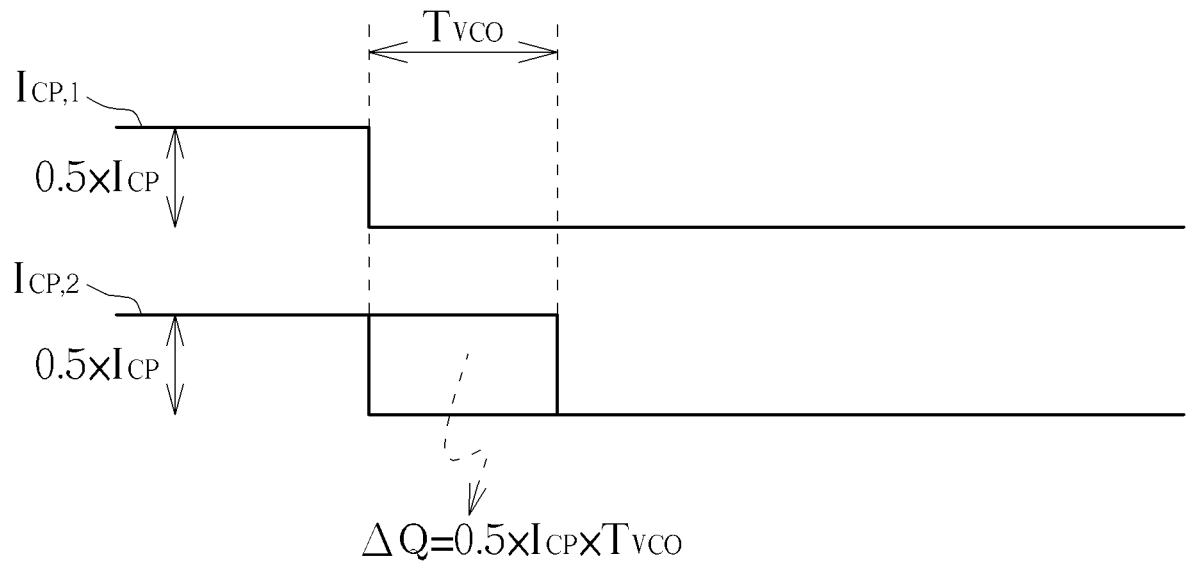
FIG. 6 is a diagram illustrating operations of CP currents shown in FIG. 5 under different variable delays of a divided clock according to an embodiment of the present invention.

FIG. 6 is a diagram illustrating operations of the CP currents $I_{CP,1}$ and $I_{CP,2}$ shown in FIG. 5 under different variable delays of the divided clock $CK_{DIV,2}$ (e.g. different selections of B) according to an embodiment of the present invention, where the period of providing the CP current $I_{CP,1}$ (e.g. $0.5 \times I_{CP}$) to the LPF 32 may be illustrated by a high state of the CP current $I_{CP,1}$ and the period of providing the CP current $I_{CP,2}$ (e.g. $0.5 \times I_{CP}$) to the LPF 32 may be illustrated by a high state of the CP current $I_{CP,2}$. When B=0, the divided clock $CK_{DIV,2}$ has no delay relative to the divided clock $CK_{DIV,1}$, and the period of providing the CP current $I_{CP,2}$ to the LPF 32 is therefore the same as the CP currents $I_{CP,1}$, where this condition may correspond to a first quantization level. When B=1, the divided clock $CK_{DIV,2}$ has $1 \times T_{VCO}$ delay relative to the divided clock $CK_{DIV,1}$, and the charges being provided to the LPF 32 in this condition (which may correspond to a second quantization level) may be $0.5 \times I_{CP} \times T_{VCO}$ more than the condition of B=0. As the value of B is selected from 0 and 1, a charge difference $\Delta Q$ (which may be regarded as the quantization step) between different selections of B may be represented by $0.5 \times I_{CP} \times T_{VCO}$ as shown in FIG. 6, and therefore the quantization step is halved in comparison with the embodiment of FIG. 2 (e.g. is decreased from $1 \times I_{CP} \times T_{VCO}$ to $0.5 \times I_{CP} \times T_{VCO}$). Thus, SDM noise and/or CP noise can be reduced.

In addition to the CPs portion, the PFD portion of the embodiment of FIG. 1 is also sliced into two PFDs (e.g. the PFDs 311 and 312 shown in FIG. 3 and FIG. 5). Assume that noise of the PFD 311 and noise of the PFD 312 are un-correlated. Total noise of the PFD 311 and noise of the PFD 312 (which may be collectively referred to as PFD noise) can be reduced by 3 decibel (dB). In some embodiment, the PFD noise may contribute a higher percentage of overall phase noise of the fractional-N PLL 30 under a higher frequency of the reference clock $CK_{REF}$, and the improvement regarding the PFD noise related performance may be significant.

Figure 7:
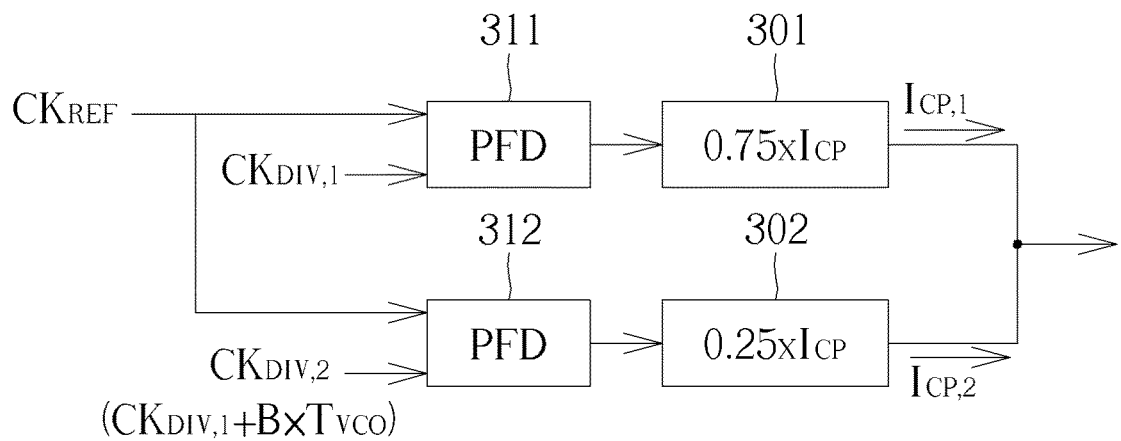
FIG. 7 is a diagram illustrating some details related to PFDs and CPs according to an embodiment of the present invention.

FIG. 7 is a diagram illustrating some details related to PFDs (e.g. the PFDs 311 and 312) and CPs (e.g. the CPs 302 and 301) according to an embodiment of the present invention. In this embodiment, it is assumed that B has four candidate values (e.g. B=0, 1, 2 or 3), and the CP current $I_{CP}$ may be sliced into the CP current $I_{CP,1}$ provided by the CP 301 and the CP current $I_{CP,2}$ provided by the CP 302, where the CP current $I_{CP,1}$ may be $0.75 \times I_{CP}$ and the CP current $I_{CP,2}$ may be $0.25 \times I_{CP}$ (which are respectively labeled on the CPs 301 and 302 for better comprehension), and therefore makes a total CP current of this embodiment be the same as the embodiment of FIG. 2.

Figure 8:
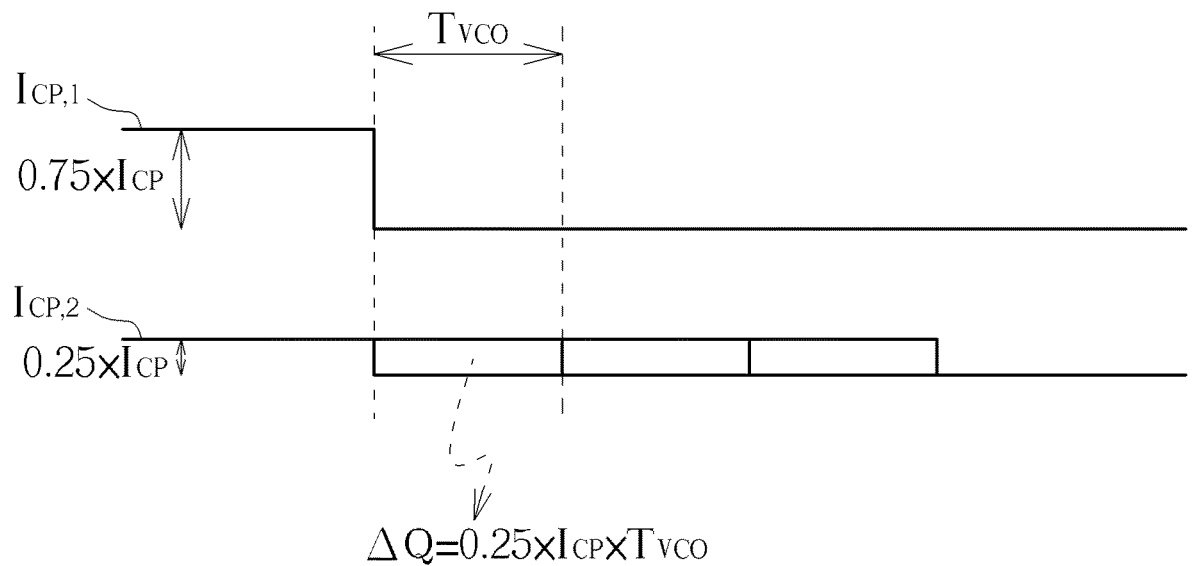
FIG. 8 is a diagram illustrating operations of CP currents shown in FIG. 7 under different variable delays of a divided clock according to an embodiment of the present invention.

FIG. 8 is a diagram illustrating operations of the CP currents $I_{CP,1}$ and $I_{CP,2}$ shown in FIG. 7 under different variable delays of the divided clock $CK_{DIV,2}$ (e.g. different selections of B) according to an embodiment of the present invention, where the period of providing the CP current $I_{CP,1}$ (e.g. $0.75 \times I_{CP}$) to the LPF 32 may be illustrated by a high state of the CP current $I_{CP,1}$, and the period of providing the CP current $I_{CP,2}$ (e.g. $0.25 \times I_{CP}$) to the LPF 32 may be illustrated by a high state of the CP current $I_{CP,2}$. When B=0, the divided clock $CK_{DIV,2}$ has no delay relative to the divided clock $CK_{DIV,1}$, and the period of providing the CP current $I_{CP,2}$ to the LPF 32 is therefore the same as the CP currents $I_{CP,1}$, where this condition may correspond to a first quantization level. When B=1, the divided clock $CK_{DIV,2}$ has $1 \times T_{VCO}$ delay relative to the divided clock $CK_{DIV,1}$, and the charges being provided to the LPF 32 in this condition (which may correspond to a second quantization level) may be $0.25 \times I_{CP} \times T_{VCO}$ more than the condition of B=0. When B=2, the divided clock $CK_{DIV,2}$ has $2 \times T_{VCO}$ delay relative to the divided clock $CK_{DIV,1}$, and the charges being provided to the LPF 32 in this condition (which may correspond to a third quantization level) may be $0.5 \times I_{CP} \times T_{VCO}$ more than the condition of B=0. When B=3, the divided clock $CK_{DIV,2}$ has $3 \times T_{VCO}$ delay relative to the divided clock $CK_{DIV,1}$, and the charges being provided to the LPF 32 in this condition (which may correspond to a fourth quantization level) may be $0.75 \times I_{CP} \times T_{VCO}$ more than the condition of B=0. As the value of B is selected from 0, 1, 2 and 3, the charge difference ΔQ (e.g. the quantization step) between different selections of B may be represented by $0.25 \times I_{CP} \times T_{VCO}$ as shown in FIG. 8, and therefore the quantization step is further halved in comparison with the embodiment of FIG. 6 (e.g. is decreased to $0.25 \times I_{CP} \times T_{VCO}$). Thus, SDM noise and/or CP noise can be further reduced.

Figure 9:
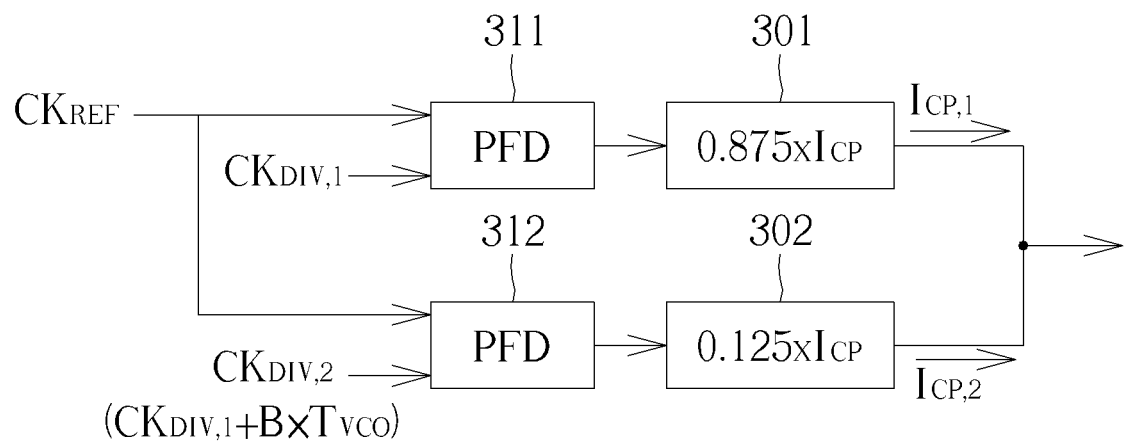
FIG. 9 is a diagram illustrating some details related to PFDs and CPs according to an embodiment of the present invention.

FIG. 9 is a diagram illustrating some details related to PFDs (e.g. the PFDs 311 and 312) and CPs (e.g. the CPs 302 and 301) according to an embodiment of the present invention. In this embodiment, it is assumed that B has eight candidate values (e.g. B=0, 1, 2, 3, 4, 5, 6 or 7), and the CP current $I_{CP}$ may be sliced into the CP current $I_{CP,1}$ provided by the CP 301 and the CP current $I_{CP,2}$ provided by the CP 302, where the CP current $I_{CP,1}$ may be $0.875 \times I_{CP}$ and the CP current $I_{CP,2}$ may be $0.125 \times I_{CP}$ (which are respectively labeled on the CPs 301 and 302 for better comprehension), and therefore makes a total CP current of this embodiment be the same as the embodiment of FIG. 2.

Figure 10:
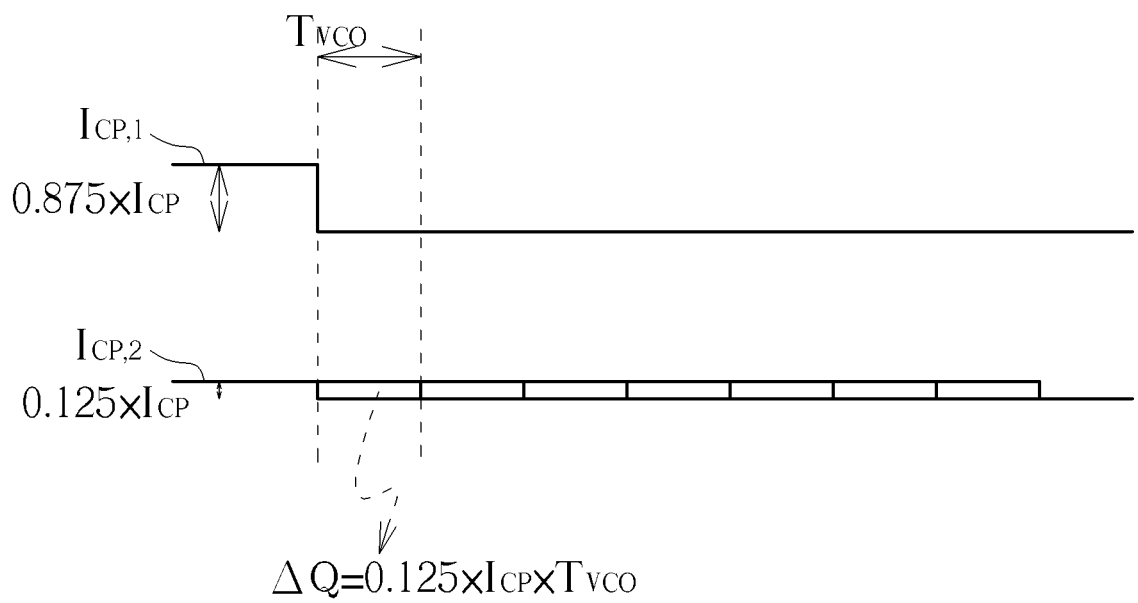
FIG. 10 is a diagram illustrating operations of CP currents shown in FIG. 9 under different variable delays of a divided clock according to an embodiment of the present invention.

FIG. 10 is a diagram illustrating operations of the CP currents $I_{CP,1}$ and $I_{CP,2}$ shown in FIG. 9 under different variable delays of the divided clock $CK_{DIV,2}$ (e.g. different selections of B) according to an embodiment of the present invention, where the period of providing the CP current $I_{CP,1}$ (e.g. $0.875 \times I_{CP}$) to the LPF 32 may be illustrated by a high state of the CP current $I_{CP,1}$, and the period of providing the CP current $I_{CP,2}$ (e.g. $0.125 \times I_{CP}$) to the LPF 32 may be illustrated by a high state of the CP current $I_{CP,2}$. When B=0, the divided clock $CK_{DIV,2}$ has no delay relative to the divided clock $CK_{DIV,1}$, and the period of providing the CP currents $I_{CP,2}$ to the LPF 32 is therefore the same as the CP currents $I_{CP,1}$, where this condition may correspond to a first quantization level. When B=1, the divided clock $CK_{DIV,2}$ has $1 \times T_{VCO}$ delay relative to the divided clock $CK_{DIV,1}$, and the charges being provided to the LPF 32 in this condition (which may correspond to a second quantization level) may be $0.125 \times I_{CP} \times T_{VCO}$ more than the condition of B=0. When B=2, the divided clock $CK_{DIV,2}$ has $2 \times T_{VCO}$ delay relative to the divided clock $CK_{DIV,1}$, and the charges being provided to the LPF 32 in this condition (which may correspond to a third quantization level) may be $0.25 \times I_{CP} \times T_{VCO}$ more than the condition of B=0. When B=3, the divided clock $CK_{DIV,2}$ has $3 \times T_{VCO}$ delay relative to the divided clock $CK_{DIV,1}$, and the charges being provided to the LPF 32 in this condition (which may correspond to a fourth quantization level) may be $0.375 \times I_{CP} \times T_{VCO}$ more than the condition of B=0. When B=4, the divided clock $CK_{DIV,2}$ has $4 \times T_{VCO}$ delay relative to the divided clock $CK_{DIV,1}$, and the charges being provided to the LPF 32 in this condition (which may correspond to a fifth quantization level) may be $0.5 \times I_{CP} \times T_{VCO}$ more than the condition of B=0. When B=5, the divided clock $CK_{DIV,2}$ has $5 \times T_{VCO}$ delay relative to the divided clock $CK_{DIV,1}$, and the charges being provided to the LPF 32 in this condition (which may correspond to a sixth quantization level) may be $0.625 \times I_{CP} \times T_{VCO}$ more than the condition of B=0. When B=6, the divided clock $CK_{DIV,2}$ has $6 \times T_{VCO}$ delay relative to the divided clock $CK_{DIV,1}$, and the charges being provided to the LPF 32 in this condition (which may correspond to a seventh quantization level) may be $0.75 \times I_{CP} \times T_{VCO}$ more than the condition of B=0. When B=7, the divided clock $CK_{DIV,2}$ has $7 \times T_{VCO}$ delay relative to the divided clock $CK_{DIV,1}$, and the charges being provided to the LPF 32 in this condition (which may correspond to an eighth quantization level) may be $0.875 \times I_{CP} \times T_{VCO}$ more than the condition of B=0. As the value of B is selected from 0, 1, 2, 3, 4, 5, 6 and 7, the charge difference ΔQ (e.g. the quantization step) between different selections of B may be represented by $0.125 \times I_{CP} \times T_{VCO}$ as shown in FIG. 10, and therefore the quantization step is further halved in comparison with the embodiment of FIG. 8 (e.g. is decreased to $0.125 \times I_{CP} \times T_{VCO}$). Thus, SDM noise and/or CP noise can be further reduced.

It should be noted that the number of quantization levels is not limited to any specific value. In particular, B may have X candidate values, where X can be any positive integer greater than one. When B has X candidate values and a total current of the CPs 301 and 302 is $I_{CP}$ (e.g. $I_{CP,1}+I_{CP,2}=I_{CP}$), the CP current $I_{CP,1}$ may be $(1-(1/X)) \times I_{CP}$, and the CP current $I_{CP,2}$ may be $(1/X) \times I_{CP}$. Those skilled in this art should understand how to modify detailed architecture of the DTC 361 based on the embodiment of FIG. 4 in response to a different number of candidate values of B, and related details are omitted here for brevity.

Note that, when the number of candidate values of B increases, the period of providing the CP current $I_{CP,2}$ to the LPF 32 may be extended as shown in FIG. 6, FIG. 8 and FIG. 10. For example, the CP current $I_{CP,2}$ may requires an additional period of $1 \times T_{VCO}$ for pumping charges to the LPF 32 when B=1 in the embodiment of FIG. 6. In another example, the CP current $I_{CP,2}$ may require an additional period of $3 \times T_{VCO}$ for pumping charges to the LPF 32 when B=3 in the embodiment of FIG. 8. In yet another example, the CP current $I_{CP,2}$ may require an additional period of $7 \times T_{VCO}$ for pumping charges to the LPF 32 when B=7 in the embodiment of FIG. 10. Increasing the number of quantization levels indeed obtain finer resolution of charge pump. However, unlimitedly increasing the number of quantization levels is not allowed, since a cycle period of the reference clock $CK_{REF}$ may be insufficient when the number of quantization levels reaches a certain value. In particular, the operation of pumping charges to the LPF 32 needs to be completed before the next edge (e.g. a following falling edge) of the reference clock $CK_{REF}$, e.g. the period of providing the CP current $I_{CP,2}$ to the LPF 32 cannot be extended over the next edge such as the following falling edge of the reference clock $CK_{REF}$. Thus, the number of candidate values of B cannot be unlimitedly increased in practice, and decreasing of the quantization step is therefore limited.

Figure 11:
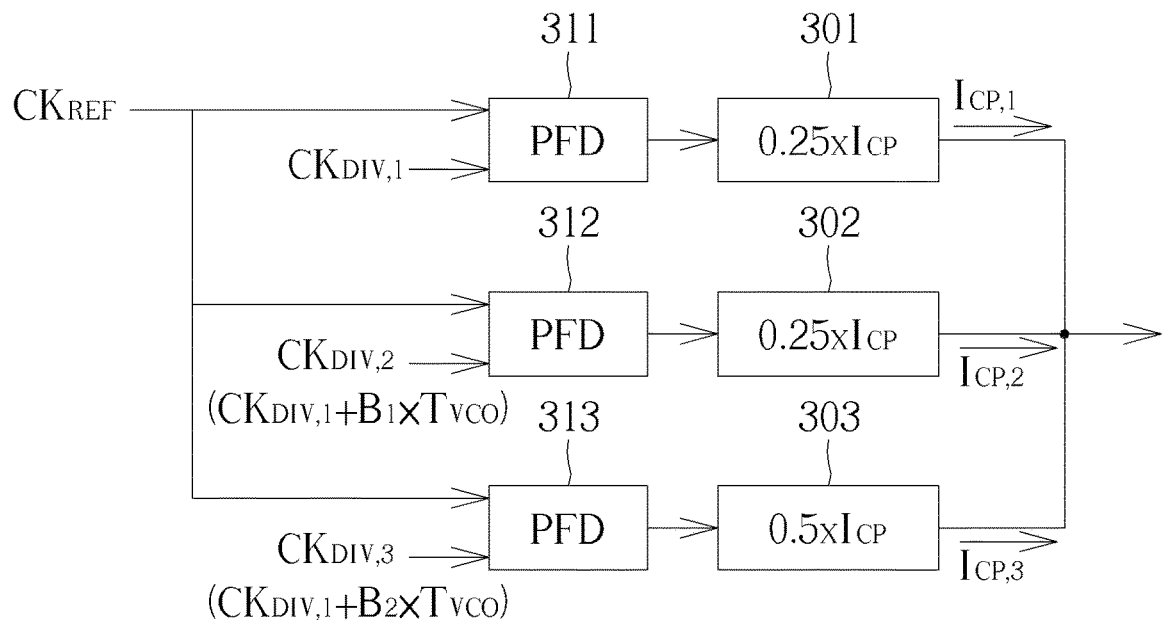
FIG. 11 is a diagram illustrating some details related to PFDs and CPs according to an embodiment of the present invention.

In order to overcome the aforementioned limitation, the fractional-N PLL 30 may further comprise a third current source such as a CP 303 and a third PFD such as a PFD 313 coupled to the CP 303 as shown in FIG. 11, where FIG. 11 merely shows the portion of CPs and PFDs within the fractional-N PLL 30 for brevity. In this embodiment, the CP 303 is configured to provide a third current such as a CP current $I_{CP,3}$, and the PFD 313 is configured to generate a third detection signal according to a third divided clock such as a divided clock $CK_{DIV,3}$, for controlling the CP 303. For example, the PFD 313 may detect a third phase difference between the reference clock $CK_{REF}$ and the divided clock $CK_{DIV,3}$, and may be dedicated to control the CP 303 to output the CP current $I_{CP,3}$ to the LPF 32 based on the third phase difference (e.g. a period between a rising edge of the reference clock $CK_{REF}$ and a rising edge of the divided clock $CK_{DIV,3}$ may represent the period of providing the CP current $I_{CP,3}$ to the LPF 32). In particular, the divided clock controller 36 delays the divided clock $CK_{MMD}$ by $B_1$ times the oscillation period $T_{VCO}$ for generating the divided clock $CK_{DIV,2}$ and delays the divided clock $CK_{MMD}$ by $B_2$ times the oscillation period $T_{VCO}$ for generating the divided clock $CK_{DIV,3}$. It should be noted that an additional flip-flop within the retimer 362 and an additional DTC may be required for generating the divided clock $CK_{DIV,3}$. As the generation of the divide clock $CK_{DIV,3}$ is similar to the divided clock $CK_{DIV,2}$, those skilled in this art should understand how to modify the detailed architecture of the divided clock controller 36 of FIG. 3 in response to the configuration shown in FIG. 11.

As mentioned above, the divided clock $CK_{DIV,1}$ may be regarded as the retimed version of the divided clock $CK_{MMD}$, and "$CK_{DIV,1}+B_1 \times T_{VCO}$" and "$CK_{DIV,1}+B_2 \times T_{VCO}$" are respectively illustrated under the divided clocks $CK_{DIV,2}$ and $CK_{DIV,3}$, for brevity. In this embodiment, each of $B_1$ and $B_2$ is an integer controlled by the selection signal SEL varying in response to the at least one modulated signal, where each of $B_1$ and $B_2$ may have two candidate values (e.g. $B_1=0$ or 1, and $B_2=0$ or 1), but the present invention is not limited thereto. For example, the selection signal may be a two-bit signal, where $B_1$ may represent a first bit of this two-bit signal, and $B_2$ may represent a second bit of this two-bit signal. In addition, a total CP current of this embodiment is set to be $I_{CP}$, where the CP current $I_{CP,1}$ may be $(1/2^n) \times I_{CP}$, the CP current $I_{CP,2}$ may be $(1/2^n) \times I_{CP}$, and the CP current $I_{CP,3}$ may be $(2/2^n) \times I_{CP}$. In this embodiment, the CP current $I_{CP}$ may be sliced into the CP current $I_{CP,1}$ provided by the CP 301, the CP current $I_{CP,2}$ provided by the CP 302 and the CP current $I_{CP,3}$ provided by the CP 303, where the CP current $I_{CP,1}$ may be $0.25 \times I_{CP}$, the CP current $I_{CP,2}$ may be $0.25 \times I_{CP}$, and the CP current $I_{CP,3}$ may be $0.5 \times I_{CP}$ (which are respectively labeled on the CPs 301, 302 and 303 for better comprehension), i.e. n=2, and therefore makes the total CP current of this embodiment be the same as the embodiment of FIG. 2.

Figure 12:
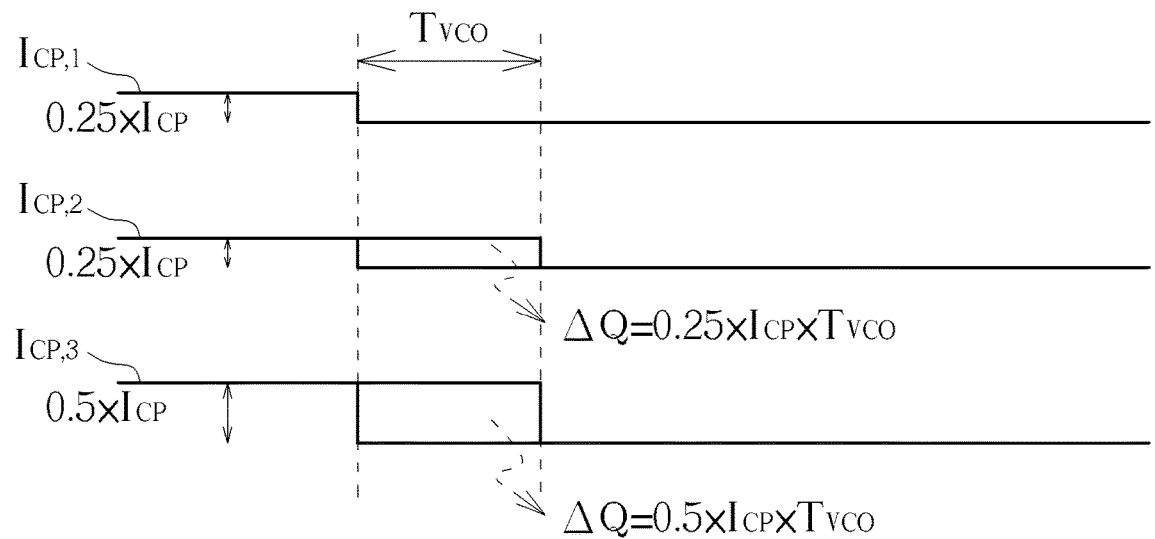
FIG. 12 is a diagram illustrating operations of CP currents shown in FIG. 11 under different variable delays of divided clocks according to an embodiment of the present invention

FIG. 12 is a diagram illustrating operations of the CP currents $I_{CP,1}$, $I_{CP,2}$ and $I_{CP,3}$ shown in FIG. 11 under different variable delays of the divided clocks $CK_{DIV,2}$ and $CK_{DIV,3}$ (e.g. different selections of $B_1$ and $B_2$) according to an embodiment of the present invention, where the period of providing the CP current $I_{CP,1}$ (e.g. $0.25 \times I_{CP}$) to the LPF 32 may be illustrated by a high state of the CP current $I_{CP,1}$, the period of providing the CP current $I_{CP,2}$ (e.g. $0.25 \times I_{CP}$) to the LPF 32 may be illustrated by a high state of the CP current $I_{CP,2}$, and the period of providing the CP current $I_{CP,3}$ (e.g. $0.5 \times I_{CP}$) to the LPF 32 may be illustrated by a high state of the CP current $I_{CP,3}$. When $B_1=0$ and $B_2=0$, both of the divided clocks $CK_{DIV,2}$ and $CK_{DIV,3}$ have no delay relative to the divided clock $CK_{DIV,1}$, and the periods of providing the CP currents $I_{CP,2}$ and $I_{CP,3}$ to the LPF 32 are therefore the same as the CP currents $I_{CP,1}$, where this condition may correspond to a first quantization level. When $B_1=1$ and $B_2=0$, the divided clock $CK_{DIV,2}$ has $1 \times T_{VCO}$ delay and the divided clock $CK_{DIV,3}$ has no delay relative to the divided clock $CK_{DIV,1}$, and the charges being provided to the LPF 32 in this condition (which may correspond to a second quantization level) may be $0.25 \times I_{CP} \times T_{VCO}$ more than the condition of $B_1=0$ and $B_2=0$. When $B_1=0$ and $B_2=1$, the divided clock $CK_{DIV,2}$ has no delay and the divided clock $CK_{DIV,3}$ has $1 \times T_{VCO}$ delay relative to the divided clock $CK_{DIV,1}$, and the charges being provided to the LPF 32 in this condition (which may correspond to a third quantization level) may be $0.5 \times I_{CP} \times T_{VCO}$ more than the condition of $B_1=0$ and $B_2=0$. When $B_1=1$ and $B_2=1$, both of the divided clocks $CK_{DIV,2}$ and $CK_{DIV,3}$ have $1 \times T_{VCO}$ delay relative to the divided clock $CK_{DIV,1}$, and the charges being provided to the LPF 32 in this condition (which may correspond to a fourth quantization level) may be $0.75 \times I_{CP} \times T_{VCO}$ more than the condition of $B_1=0$ and $B_2=0$. Thus, this embodiment can obtain a quantization step that is the same as the embodiment of FIG. 8 (i.e. $0.25 \times I_{CP} \times T_{VCO}$), and the required time for completing the operation of pumping charges to the LPF 32 can be reduced (e.g. only $1 \times T_{VCO}$ delay is required at most in this embodiment) in comparison with the embodiment of FIG. 8.

Figure 13:
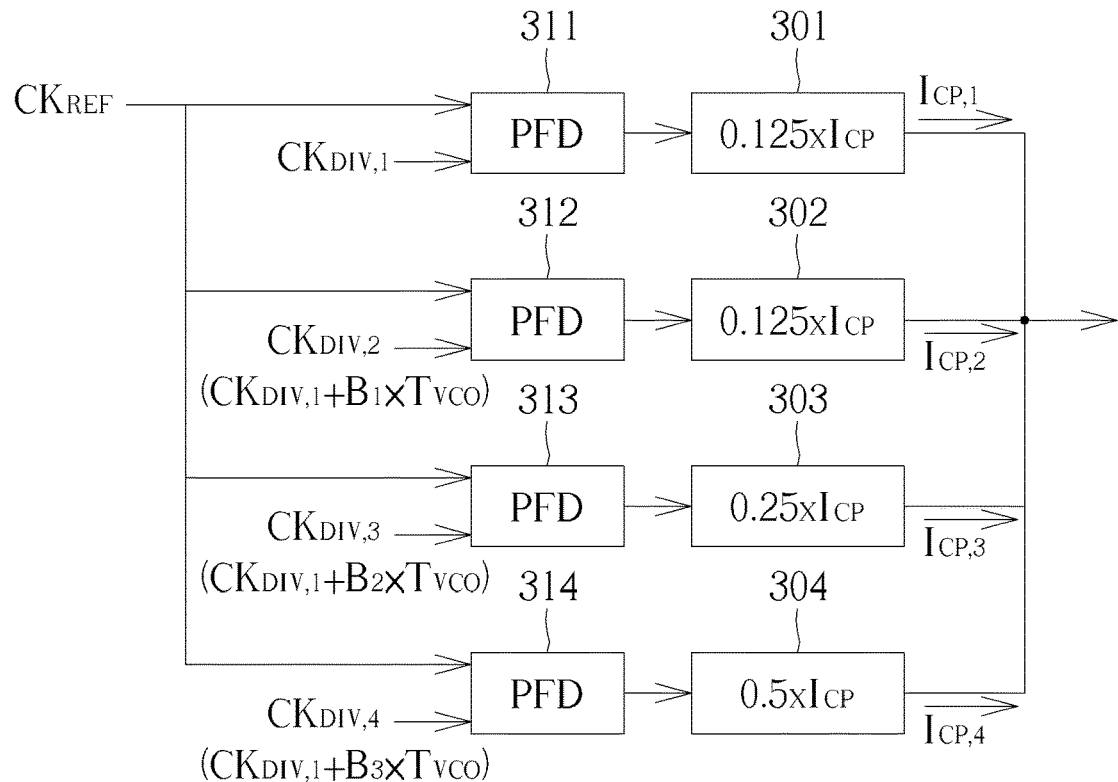
FIG. 13 is a diagram illustrating some details related to PFDs and CPs according to an embodiment of the present invention.

In order to further improve the resolution of charge pump, the fractional-N PLL 30 may further comprise a fourth current source such as a CP 304 and a fourth PFD such as a PFD 314 coupled to the CP 304 as shown in FIG. 13, where FIG. 13 merely shows the portion of CPs and PFDs within the fractional-N PLL 30 for brevity. In this embodiment, the CP 304 is configured to provide a fourth current such as a CP current $I_{CP,4}$, and the PFD 314 is configured to generate a fourth detection signal according to a fourth divided clock such as a divided clock $CK_{DIV,4}$, for controlling the CP 304. For example, the PFD 314 may detect a fourth phase difference between the reference clock $CK_{REF}$ and the divided clock $CK_{DIV,4}$, and may be dedicated to control the CP 304 to output the CP current $I_{CP,4}$ to the LPF 32 based on the fourth phase difference (e.g. a period between a rising edge of the reference clock $CK_{REF}$ and a rising edge of the divided clock $CK_{DIV,4}$ may represent the period of providing the CP current $I_{CP,4}$ to the LPF 32). In particular, the divided clock controller 36 delays the divided clock $CK_{MMD}$ by $B_3$ times the oscillation period $T_{VCO}$ for generating the divided clock $CK_{DIV,2}$. It should be noted that another additional flip-flop within the retimer 362 and another additional DTC may be required for generating the divided clock $CK_{DIV,4}$. As the generation of the divide clock $CK_{DIV,4}$ is similar to the divided clock $CK_{DIV,2}$, those skilled in this art should understand how to modify the detailed architecture of the divided clock controller 36 of FIG. 3 in response to the configuration shown in FIG. 13.

As mentioned above, the divided clock $CK_{DIV,1}$ may be regarded as the retimed version of the divided clock $CK_{MMD}$, and "$CK_{DIV,1}+B_3 \times T_{VCO}$" is illustrated under the divided clock $CK_{DIV,4}$, for brevity. In this embodiment, each of $B_1$, $B_2$ and $B_3$ is an integer controlled by the selection signal SEL varying in response to the at least one modulated signal, where each of $B_1$, $B_2$ and $B_3$ may have two candidate values (e.g. $B_1=0$ or 1, $B_2=0$ or 1, and $B_3=0$ or 1), but the present invention is not limited thereto. For example, the selection signal may be a three-bit signal, where $B_1$ may represent a first bit of this three-bit signal, $B_2$ may represent a second bit of this three-bit signal, and $B_3$ may represent a third bit of this three-bit signal. In addition, a total CP current of this embodiment is set to be $I_{CP}$, where the CP current $I_{CP,1}$ may be $(1/2^n) \times I_{CP}$, the CP current $I_{CP,2}$ may be $(1/2^n) \times I_{CP}$, the CP current $I_{CP,3}$ may be $(2/2^n) \times I_{CP}$, and the CP current $I_{CP,4}$ may be $(4/2^n) \times I_{CP}$. In this embodiment, the CP current $I_{CP}$ may be sliced into the CP current $I_{CP,1}$ provided by the CP 301, the CP current $I_{CP,2}$ provided by the CP 302, the CP current $I_{CP,3}$ provided by the CP 303, and the CP current $I_{CP,4}$ provided by the CP 304, where the CP current $I_{CP,1}$ may be $0.125 \times I_{CP}$, the CP current $I_{CP,2}$ may be $0.125 \times I_{CP}$, the CP current $I_{CP,3}$ may be $0.25 \times I_{CP}$, and the CP current $I_{CP,4}$ may be $0.5 \times I_{CP}$ (which are respectively labeled on the CPs 301, 302, 303 and 304 for better comprehension), i.e. n=3, and therefore makes a total CP current of this embodiment be the same as the embodiment of FIG. 2.

Figure 14:
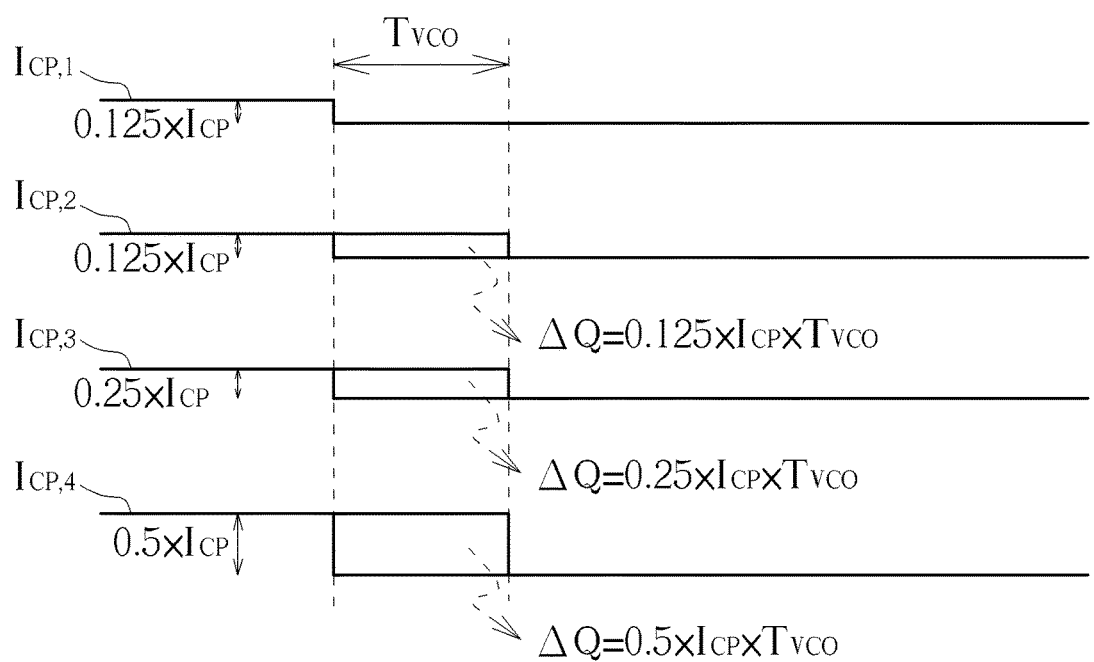
FIG. 14 is a diagram illustrating operations of CP currents shown in FIG. 13 under different variable delays of divided clocks according to an embodiment of the present invention.

FIG. 14 is a diagram illustrating operations of the CP currents $I_{CP,1}$, $I_{CP,2}$, $I_{CP,3}$ and $I_{CP,4}$ shown in FIG. 13 under different variable delays of the divided clocks $CK_{DIV,2}$, $CK_{DIV,3}$ and $CK_{DIV,4}$ (e.g. different selections of $B_1$, $B_2$ and $B_3$) according to an embodiment of the present invention, where the period of providing the CP current $I_{CP,1}$ (e.g. $0.125 \times I_{CP}$) to the LPF 32 may be illustrated by a high state of the CP current $I_{CP,1}$, the period of providing the CP current $I_{CP,2}$ (e.g. $0.125 \times I_{CP}$) to the LPF 32 may be illustrated by a high state of the CP current $I_{CP,2}$, the period of providing the CP current $I_{CP,3}$ (e.g. $0.25 \times I_{CP}$) to the LPF 32 may be illustrated by a high state of the CP current $I_{CP,3}$, and the period of providing the CP current $I_{CP,4}$ (e.g. $0.5 \times I_{CP}$) to the LPF 32 may be illustrated by a high state of the CP current $I_{CP,4}$.

When $B_1=0$, $B_2=0$ and $B_3=0$, all of the divided clocks $CK_{DIV,2}$, $CK_{DIV,3}$ and $CK_{DIV,4}$ have no delay relative to the divided clock $CK_{DIV,1}$, and the periods of providing the CP currents $I_{CP,2}$ $I_{CP,3}$ and $I_{CP,4}$ to the LPF 32 are therefore the same as the CP currents $I_{CP,1}$, where this condition may correspond to a first quantization level. When $B_1=1$, $B_2=0$ and $B_3=0$, the divided clock $CK_{DIV,2}$ has $1 \times T_{VCO}$ delay and both of the divided clocks $CK_{DIV,3}$ and $CK_{DIV,4}$ have no delay relative to the divided clock $CK_{DIV,1}$, and the charges being provided to the LPF 32 in this condition (which may correspond to a second quantization level) may be $0.125 \times I_{CP} \times T_{VCO}$ more than the condition of $B_1=0$, $B_2=0$ and $B_3=0$. When $B_1=0$, $B_2=1$ and $B_3=0$, the divided clock $CK_{DIV,3}$ has $1 \times T_{VCO}$ delay and both of the divided clocks $CK_{DIV,2}$ and $CK_{DIV,4}$ have no delay relative to the divided clock $CK_{DIV,1}$, and the charges being provided to the LPF 32 in this condition (which may correspond to a third quantization level) may be $0.25 \times I_{CP} \times T_{VCO}$ more than the condition of $B_1=0$, $B_2=0$ and $B_3=0$. When $B_1=1$, $B_2=1$ and $B_3=0$, both of the divided clocks $CK_{DIV,2}$ and $CK_{DIV,3}$ have $1 \times T_{VCO}$ delay and the divided clock $CK_{DIV,4}$ has no delay relative to the divided clock $CK_{DIV,1}$, and the charges being provided to the LPF 32 in this condition (which may correspond to a fourth quantization level) may be $0.375 \times I_{CP} \times T_{VCO}$ more than the condition of $B_1=0$, $B_2=0$ and $B_3=0$. When $B_1=0$, $B_2=0$ and $B_3=1$, the divided clock $CK_{DIV,4}$ has $1 \times T_{VCO}$ delay and both of the divided clocks $CK_{DIV,2}$ and $CK_{DIV,3}$ have no delay relative to the divided clock $CK_{DIV,1}$, and the charges being provided to the LPF 32 in this condition (which may correspond to a fifth quantization level) may be $0.5 \times I_{CP} \times T_{VCO}$ more than the condition of $B_1=0$, $B_2=0$ and $B_3=0$. When $B_1=1$, $B_2=0$ and $B_3=1$, both of the divided clocks $CK_{DIV,2}$ and $CK_{DIV,4}$ have $1 \times T_{VCO}$ delay and the divided clock $CK_{DIV,3}$ has no delay relative to the divided clock $CK_{DIV,1}$, and the charges being provided to the LPF 32 in this condition (which may correspond to a sixth quantization level) may be $0.625 \times I_{CP} \times T_{VCO}$ more than the condition of $B_1=0$, $B_2=0$ and $B_3=0$. When $B_1=0$, $B_2=1$ and $B_3=1$, both of the divided clocks $CK_{DIV,3}$ and $CK_{DIV,4}$ have $1 \times T_{VCO}$ delay and the divided clock $CK_{DIV,2}$ has no delay relative to the divided clock $CK_{DIV,1}$, and the charges being provided to the LPF 32 in this condition (which may correspond to a seventh quantization level) may be $0.75 \times I_{CP} \times T_{VCO}$ more than the condition of $B_1=0$, $B_2=0$ and $B_3=0$. When $B_1=1$, $B_2=1$ and $B_3=1$, all of the divided clocks $CK_{DIV,2}$, $CK_{DIV,3}$ and $CK_{DIV,4}$ have $1 \times T_{VCO}$ delay relative to the divided clock $CK_{DIV,1}$, and the charges being provided to the LPF 32 in this condition (which may correspond to a seventh quantization level) may be $0.875 \times I_{CP} \times T_{VCO}$ more than the condition of $B_1=0$, $B_2=0$ and $B_3=0$. Thus, this embodiment can obtain a quantization step that is the same as the embodiment of FIG. 10 (i.e. $0.125 \times I_{CP} \times T_{VCO}$), and the required time for completing the operation of pumping charges to the LPF 32 can be reduced (e.g. only $1 \times T_{VCO}$ delay is required at most in this embodiment) in comparison with the embodiment of FIG. 10.

In view of the embodiments of FIG. 11 and FIG. 13, it should be noted that the CP current $I_{CP}$ may be sliced into an arbitrary number of branches, which are respectively controlled by a corresponding number of PFDs. Assume that the CP current $I_{CP}$ is sliced into M branches. When M=2, these CP current branches may be $(1/2) \times I_{CP}$ and $(1/2) \times I_{CP}$ respectively; when M=3, these CP current branches may be $(1/4) \times I_{CP}$, $(1/4) \times I_{CP}$ and $(1/2) \times I_{CP}$ respectively; when M=4, these CP current branches may be $(1/8) \times I_{CP}$, $(1/8) \times I_{CP}$, $(1/4) \times I_{CP}$ and $(1/2) \times I_{CP}$ respectively; when M=5, these CP current branches may be $(1/16) \times I_{CP}$, $(1/16) \times I_{CP}$, $(1/8) \times I_{CP}$, $(1/4) \times I_{CP}$ and $(1/2) \times I_{CP}$ respectively; and deduced by analogy, when M>5, these current branches may be $(1/2^n) \times I_{CP}$, $(1/2^n) \times I_{CP}$, $(1/2^{(n-1)}) \times I_{CP}$, $(1/2^{(n-2)}) \times I_{CP}$, ... and $(1/2^{(n-M)}) \times I_{CP}$ respectively, where n=M−1.

Figure 15:
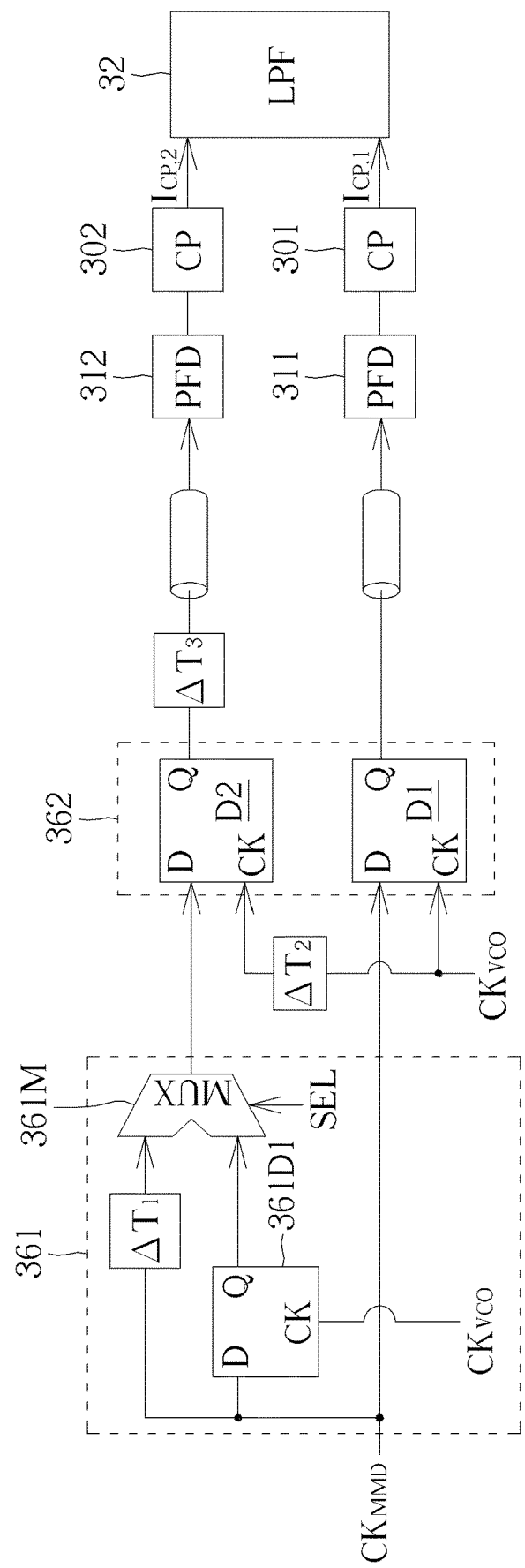
FIG. 15 is a diagram illustrating some timing mismatch issues according to an embodiment of the present invention.

FIG. 15 is a diagram illustrating some timing mismatch issues according to an embodiment of the present invention. For brevity, FIG. 15 merely shows the divided clock controller 361, the retimer 362, the PFDs 311 and 312, the CPs 301 and 302, and the LPF 32. In this embodiment, $\Delta T_1$ may represent timing mismatch between two paths of the MUX 361, i.e. timing mismatch between B=0 and B=1. As the signal output from the MUX 361M may be retimed by the retimer 361, $\Delta T_1$ will not affect outputs of CPs 301 and 302. In addition, $\Delta T_2$ may represent timing mismatch between two paths of the retimer 362, and $\Delta T_3$ may represent timing mismatch between two paths of the PFD with CP sets (e.g. mismatch between the PFD 311 with the CP 301 and the PFD 312 with the CP 302). It should be noted that both of $\Delta T_2$ and $\Delta T_3$ are unrelated to SDM operations. In particular, $\Delta T_2$ and $\Delta T_3$ is fixed and always exist, which do not vary in response to different SDM patterns (e.g. different selections of B), where $\Delta T_2$ and $\Delta T_3$ merely introduce a fixed charge difference between outputs of the CPs 301 and 301, but have no noise folding concern. FIG. 15 takes the configuration of PFDs and CPs shown in FIG. 5 to FIG. 6 as an example for illustrative purpose only, and is not meant to be a limitation of the present invention. That is, under other configurations of PFDs and CPs shown in FIG. 7 to FIG. 14, the fractional-N PLL can handle the above types of timing mismatch by the same way. Thus, the fractional-N PLL 30 does not need any timing calibration or scrambling mechanism, and the phase noise can be effectively reduced without greatly increase additional costs.

Note that, current mismatch between the CP currents $I_{CP,1}$ and $I_{CP,2}$ may cause spur or in-band noise. For a low-jitter PLL, charge pump current sources require long-channel MOSFETs for low-noise purpose, which also ensures small mismatch. Typical current mismatch is about 0.001, which is much smaller than timing mismatch most of time. Thus, current mismatch is not the main concern regarding spur or in-band noise in the present invention.

As mentioned above, SDM noise, CP noise and PFD noise can be effectively reduced, an overall design may slightly compromise on the noise related performance of the VCO 33, in order to lower power consumption of the VCO 33. In some embodiment, noise of the VCO 33 (which may be referred to as VCO noise) might be slightly increased, but overall phase noise of the fractional-N PLL 30 can be maintained on a certain level as SDM noise, CP noise and PFD noise are reduced. Thus, overall power consumption of the fractional-N PLL 30 can be reduced without sacrificing phase noise related performance.

Figure 16:
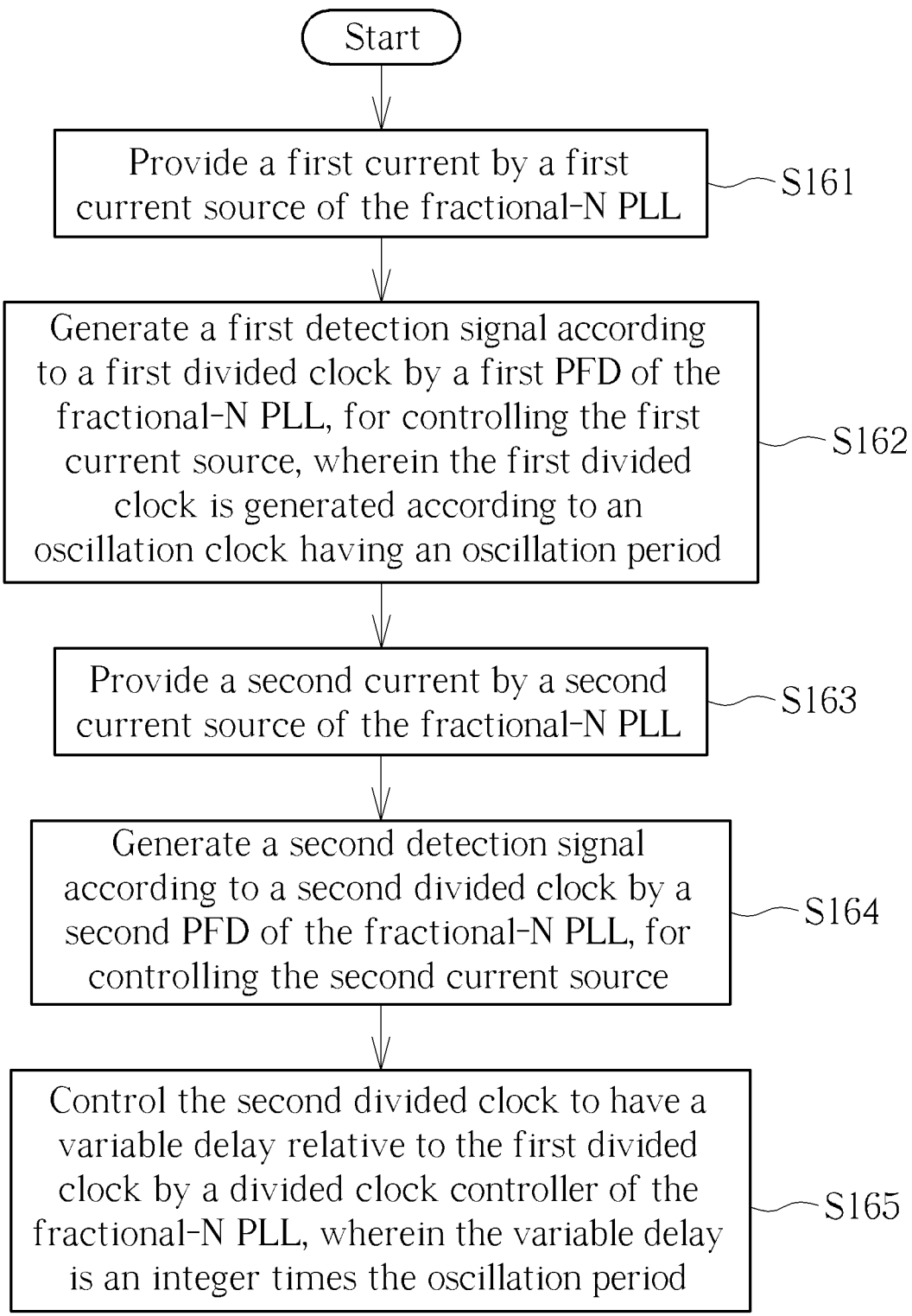
FIG. 16 is a working flow illustrating a sliced CP control method of a fractional-N PLL according to an embodiment of the present invention.

FIG. 16 is a working flow illustrating a sliced CP control method of a fractional-N PLL (e.g. the fractional-N PLL 30 shown in FIG. 3) according to an embodiment of the present invention, wherein the fractional-N PLL may operate according to any of the configurations shown in FIG. 5 to FIG. 14. It should be noted that the working flow shown in FIG. 16 is for illustrative purposes only, and is not meant to be a limitation of the present invention. In some embodiments, one or more steps may be added, deleted or modified in the working flow shown in FIG. 16. In addition, if a same result may be obtained, these steps do not have to be executed in the exact order shown in FIG. 16.

In Step S161, the fractional-N PLL 30 may provide a first current (e.g. $I_{CP,1}$) by a first current source (e.g. the CP 301) of the fractional-N PLL 30.

In Step S162, the fractional-N PLL 30 may generate a first detection signal according to a first divided clock (e.g. the divide clock $CK_{MMD}$ or the divided clock $CK_{DIV,1}$) by a first PFD (e.g. the PFD 311) of the fractional-N PLL 30, for controlling the first current source (e.g. the CP 301), wherein the first divided clock (e.g. the divide clock $CK_{MMD}$ or the divided clock $CK_{DIV,1}$) is generated according to an oscillation clock (e.g. the VCO clock $CK_{VCO}$) having an oscillation period (e.g. $T_{VCO}$).

In Step S163, the fractional-N PLL 30 may provide a second current (e.g. $I_{CP,2}$) by a second current source (e.g. the CP 302) of the fractional-N PLL 30.

In Step S164, the fractional-N PLL 30 may generate a second detection signal according to a second divided clock (e.g. the divided clock $CK_{DTC}$ or the divided clock $CK_{DIV,2}$) by a second PFD (e.g. the PFD 312) of the fractional-N PLL 30, for controlling the second current source (e.g. the CP 302).

In Step S165, the fractional-N PLL 30 may control the second divided clock (e.g. the divided clock $CK_{DTC}$ or the divided clock $CK_{DIV,2}$) to have a variable delay relative to the first divided clock (e.g. the divide clock $CK_{MMD}$ or the divided clock $CK_{DIV,1}$) by a divided clock controller (e.g. the divided clock controller 36) of the fractional-N PLL 30, wherein the variable delay is an integer times the oscillation period (e.g. $B \times T_{VCO}$).

To summarize, the fractional-N PLL provided by embodiments of the present invention can improve integrated phase noise (IPN) related performance. In particular, SDM noise can be reduced by 6 dB, 12 dB, 18 dB, etc., which depends on the number of quantization levels. CP noise can be reduced by 1 to 2 dB, due to a smaller $T_{OFFSET}$. PFD noise can be reduced 3 dB (or more, which depends on how many partitions the PFD is sliced into), due to PFDs are sliced into parallel. In addition, the fractional-N PLL may not need any PRPS or calibration mechanisms, and the proposed sliced CP control method may operate under the speed of the reference clock $CK_{REF}$ (which is a relative low frequency in comparison with the VCO clock $CK_{VCO}$). Thus, the fractional-N PLL can achieve low jitter performance, e.g. root mean square (RMS) jitter<50 femtoseconds (fs), without greatly increasing additional costs such as area and power consumption. Under the above improvement regarding SDM noise, CP noise and PFD noise related performance, more budget of VCO noise can be obtained for a low power design of a VCO within the fractional-N PLL, to thereby reduce overall power consumption of the fractional-N PLL. Thus, the present invention can improve overall performance without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fractional-N phase-locked loop (PLL), comprising:
   a first current source, configured to provide a first current;
   a first phase frequency detector (PFD), coupled to the first current source, configured to generate a first detection signal according to a first divided clock, for controlling the first current source, wherein the first divided clock is generated according to an oscillation clock having an oscillation period;
   a second current source, configured to provide a second current;
   a second PFD, coupled to the second current source, configured to generate a second detection signal according to a second divided clock, for controlling the second current source; and
   a divided clock controller, coupled to the first PFD and the second PFD, wherein the divided clock controller comprises:
   a retiming circuit, coupled to the first PFD and the second PFD, configured to receive the oscillation clock, the first divided clock and the second divided clock, to retime the first divided clock and the second divided clock according to edges of the oscillation clock.

2. The fractional-N PLL of claim 1, further comprising:
   a multi-modulus divider (MMD), configured to divide a frequency of the oscillation clock by a variable divisor to generate the first divided clock; and
   a sigma delta modulator (SDM), configured to generate at least one modulated signal according to a target divisor;
   wherein the divided clock controller is configured to control the second divided clock based on a variable delay relative to the first divided clock, the variable delay is an integer times the oscillation period, and the variable delay and the variable divisor are controlled by the SDM with aid of the at least one modulated signal.

3. The fractional-N PLL of claim 2, wherein the divided clock controller comprises:
   a digital-to-time converter (DTC), coupled to the MMD, configured to delay the first divided clock based on B times the oscillation period for generating the second divided clock;
   wherein B is an integer controlled by a selection signal varying in response to the at least one modulated signal.

4. The fractional-N PLL of claim 3, wherein the DTC comprises:
   one or more delay cells, configured to generate one or more delayed clocks, respectively; and
   a multiplexer, configured to select a selected clock from a plurality of candidate clocks to be the second divided clock according to the selection signal, wherein the candidate clocks comprise the one or more delayed clocks.

5. The fractional-N PLL of claim 3, wherein B has X candidate values, X is a positive integer greater than one, a total current of the first current source and the second current source is $I_{CP}$, the first current is $(1-(1/X)) \times I_{CP}$, and the second current is $(1/X) \times I_{CP}$.

6. The fractional-N PLL of claim 2, further comprising:
a third current source, configured to provide a third current;
a third PFD, coupled to the third current source, configured to generate a third detection signal according to a third divided clock, for controlling the third current source;
wherein the divided clock controller delays the first divided clock based on $B_1$ times the oscillation period for generating the second divided clock and delays the first divided clock based on $B_2$ times the oscillation period for generating the third divided clock, each of $B_1$ and $B_2$ is an integer controlled by a selection signal varying in response to the at least one modulated signal, a total CP current of the fractional-N PLL is $I_{CP}$, the first current is $(1/2^n) \times I_{CP}$, the second current is $(1/2^n) \times I_{CP}$, the third current is $(2/2^n) \times I_{CP}$, and n is a positive integer greater than one.

7. The fractional-N PLL of claim 6, further comprising:
a fourth current source, configured to provide a fourth current;
a fourth PFD, coupled to the fourth current source, configured to generate a fourth detection signal according to a fourth divided clock, for controlling the fourth current source;
wherein the divided clock controller delays the first divided clock based on $B_3$ times the oscillation period for generating the fourth divided clock, $B_3$ is an integer controlled by the selection signal, the fourth current is $(4/2^n) \times I_{CP}$, and n is a positive integer greater than two.

8. The fractional-N PLL of claim 1, wherein the retiming circuit comprises:
a first flip-flop, coupled between the MMD and the first PFD, configured to transmit the first divided clock from the MMD to the first PFD at the edges of the oscillation clock; and
a second flip-flop, coupled between the DTC and the second PFD, configured to transmit the second divided clock from the DTC to the second PFD at the edges of the oscillation clock.

9. A sliced charge pump (CP) control method of a fractional-N phase-locked loop (PLL), comprising:
providing a first current by a first current source of the fractional-N PLL;
generating a first detection signal according to a first divided clock by a first phase frequency detector (PFD) of the fractional-N PLL, for controlling the first current source, wherein the first divided clock is generated according to an oscillation clock having an oscillation period;
providing a second current by a second current source of the fractional-N PLL;
generating a second detection signal according to a second divided clock by a second PFD of the fractional-N PLL, for controlling the second current source; and
receiving the oscillation clock, the first divided clock and the second divided clock by a retiming circuit of a divided clock controller of the fractional-N PLL, to retime the first divided clock and the second divided clock according to edges of the oscillation clock.

10. The sliced CP control method of claim 9, further comprising:
utilizing a multi-modulus divider (MMD) to divide a frequency of the oscillation clock by a variable divisor to generate the first divided clock; and
generating at least one modulated signal by a sigma delta modulator (SDM) according to a target divisor;
wherein the divided clock controller controls the second divided clock based on a variable delay relative to the first divided clock, the variable delay is an integer times the oscillation period, and the variable delay and the variable divisor are controlled by the SDM with aid of the at least one modulated signal.

11. The sliced CP control method of claim 10, wherein controlling the second divided clock to have the variable delay relative to the first divided clock comprises:
delaying the first divided clock based on B times the oscillation period by a digital-to-time converter (DTC) for generating the second divided clock;
wherein B is an integer controlled by a selection signal varying in response to the at least one modulated signal.

12. The sliced CP control method of claim 11, wherein delaying the first divided clock by B times the oscillation period comprises:
generating one or more delayed clocks by one or more delay cells, respectively; and
selecting a selected clock from a plurality of candidate clocks to be the second divided clock by a multiplexer according to the selection signal, wherein the candidate clocks comprise the one or more delayed clocks, configured to.

13. The sliced CP control method of claim 11, wherein B has X candidate values, X is a positive integer greater than one, a total current of the first current source and the second current source is $I_{CP}$, the first current is $(1-(1/X)) \times I_{CP}$, and the second current is $(1/X) \times I_{CP}$.

14. The sliced CP control method of claim 10, further comprising:
providing a third current by a third current source;
generating a third detection signal according to a third divided clock by a third PFD, for controlling the third current source;
wherein the first divided clock is delayed based on $B_1$ times the oscillation period for generating the second divided clock and delayed based on $B_2$ times the oscillation period for generating the third divided clock, each of $B_1$ and $B_2$ is an integer controlled by a selection signal varying in response to the at least one modulated signal, a total CP current of the fractional-N PLL is $I_{CP}$, the first current is $(1/2^n) \times I_{CP}$, the second current is $(1/2^n) \times I_{CP}$, the third current is $(2/2^n) \times I_{CP}$, and n is a positive integer greater than one.

15. The sliced CP control method of claim 14, further comprising:
providing a fourth current by a fourth current source;
generating a fourth detection signal according to a fourth divided clock by a fourth PFD, for controlling the fourth current source;
wherein the first divided clock is delayed based on $B_3$ times the oscillation period for generating the fourth divided clock, $B_3$ is an integer controlled by the selection signal, the fourth current is $(4/2^n) \times I_{CP}$, and n is a positive integer greater than two.

16. The sliced CP control method of claim 9, wherein retiming the first divided clock and the second divided clock according to the edges of the oscillation clock comprises:
transmitting the first divided clock from the MMD to the first PFD at the edges of the oscillation clock by a first flip-flop; and
transmitting the second divided clock from the DTC to the second PFD at the edges of the oscillation clock by a second flip-flop.

* * * * *